(12) United States Patent
Shin

(10) Patent No.: US 9,685,219 B2
(45) Date of Patent: Jun. 20, 2017

(54) SEMICONDUCTOR MEMORY DEVICE FOR DECONCENTRATING REFRESH COMMANDS AND SYSTEM INCLUDING THE SAME

(71) Applicant: SAMSUNG ELECTRONICS CO., LTD., Suwon-si, Gyeonggi-Do (KR)

(72) Inventor: Dong Hak Shin, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/149,751

(22) Filed: May 9, 2016

(65) Prior Publication Data
US 2016/0336060 A1 Nov. 17, 2016

(30) Foreign Application Priority Data

May 13, 2015 (KR) .................. 10-2015-0066766
Jun. 4, 2015 (KR) .................. 10-2015-0079392

(51) Int. Cl.
*G11C 11/40* (2006.01)
*G11C 11/406* (2006.01)
*G11C 11/403* (2006.01)

(52) U.S. Cl.
CPC ...... *G11C 11/40607* (2013.01); *G11C 11/403* (2013.01); *G11C 11/406* (2013.01); *G11C 11/40603* (2013.01); *G11C 11/40611* (2013.01); *G11C 11/40618* (2013.01)

(58) Field of Classification Search
CPC ........... G11C 11/406; G11C 11/40603; G11C 11/40618; G11C 11/403
See application file for complete search history.

(56) References Cited

U.S. PATENT DOCUMENTS

| | | | |
|---|---|---|---|
| 7,020,038 B2 | 3/2006 | Shieh | |
| 7,543,106 B2 | 6/2009 | Choi | |
| 7,855,931 B2 | 12/2010 | LaBerge et al. | |
| 8,327,225 B2 | 12/2012 | Jeddeloh | |
| 8,453,150 B2 | 5/2013 | Chung | |
| 8,631,055 B2 | 1/2014 | Wegener | |
| 8,675,436 B2 * | 3/2014 | Kim | G11C 11/406 365/222 |
| 8,756,486 B2 | 6/2014 | LaBerge et al. | |
| 8,817,549 B2 | 8/2014 | Shin et al. | |

(Continued)

FOREIGN PATENT DOCUMENTS

| | | |
|---|---|---|
| JP | 2013-156783 | 8/2013 |
| KR | 1020120132287 | 12/2012 |

*Primary Examiner* — Vanthu Nguyen
(74) *Attorney, Agent, or Firm* — F. Chau & Associates, LLC

(57) ABSTRACT

A memory device includes a buffer memory configured to receive commands from a memory controller via first to $N^{th}$ channels, wherein N denotes an integer which is equal to or greater than '2'; and first to $N^{th}$ core memories each connected to the buffer memory via one of the first to $N^{th}$ channels. The buffer memory may deconcentrate refresh commands corresponding to the first to $N^{th}$ core memories, based on a number of commands input during a specific time.

17 Claims, 26 Drawing Sheets

(56) References Cited

U.S. PATENT DOCUMENTS

| | | |
|---|---|---|
| 8,958,259 B2 * | 2/2015 | Sakakibara ....... G11C 11/40615 365/222 |
| 9,135,210 B2 | 9/2015 | Matsumoto et al. |
| 9,236,109 B1 * | 1/2016 | Lee .................. G11C 11/40618 |
| 9,349,488 B2 * | 5/2016 | Lee .................. G11C 29/12015 |
| 2011/0087835 A1 | 4/2011 | Sato et al. |
| 2012/0047516 A1 | 2/2012 | Barwick |
| 2014/0281399 A1 | 9/2014 | Rash et al. |

\* cited by examiner

| OPs | R<0> | R<1> |
|-----|------|------|
| NOP | L | L |
| ACT | H | L |
| PRE | L | H |
| REF | H | H |

SEMICONDUCTOR MEMORY DEVICE FOR DECONCENTRATING REFRESH COMMANDS AND SYSTEM INCLUDING THE SAME

CROSS-REFERENCE TO RELATED APPLICATION

This application claims priority to Korean Patent Application Nos. 10-2015-0066766, filed on May 13, 2015 and 10-2015-0079392, filed on Jun. 4, 2015, in the Korean Intellectual Property Office, the disclosures of which are incorporated by reference in their entirety herein.

BACKGROUND

1. Technical Field

Exemplary embodiments of the inventive concept relate to a semiconductor memory device and a memory system including the same, and more particularly, to a method of refreshing a semiconductor memory device including a plurality of independent channels.

2. Discussion of Related Art

Semiconductor memory devices include non-volatile memory devices and volatile memory devices. Information stored in a non-volatile memory can be retrieved even after power is no longer applied. Volatile memory, contract to non-volatile memory, requires power to main the stored information.

A memory having a three-dimensional (3D) stack structure, such as a high-bandwidth memory (HBM), includes a buffer-die and a plurality of core-dies. The plurality of core-dies are allocated to different independent channels.

SUMMARY

According to an exemplary embodiment of the inventive concept, a memory device includes a buffer memory configured to receive commands from a memory controller via first to $N^{th}$ channels, wherein N denotes an integer which is equal to or greater than '2'; and first to $N^{th}$ core memories each connected to the buffer memory via one of the first to $N^{th}$ channels. The buffer memory deconcentrates refresh commands corresponding to the first to $N^{th}$ core memories that are input to the buffer memory via the first to $N^{th}$ channels by skipping or delaying transmission of a refresh command among the refresh commands to one of the core memories based on a number of commands input during a specific period.

In an exemplary embodiment, the buffer memory includes a refresh control determining circuit configured to count a number of commands received via the first to $N^{th}$ channels during the specific period to generate a count value, and compare the count value with a preset threshold to determine whether the refresh commands are to be deconcentrated.

In an exemplary embodiment, the refresh control determining circuit counts only refresh commands among the commands received via the first to $N^{th}$ channels to generate a count value, and outputs a refresh control signal based on a result of the compare.

In an exemplary embodiment, the buffer memory includes command decoders corresponding to the first to $N^{th}$ channels, and configured to decode the commands received via the first to $N^{th}$ channels and output command selection signals according to whether the decoded commands are refresh commands or not; refresh control circuits corresponding to the first to $N^{th}$ channels, and configured to selectively delay or skip the refresh commands according to the refresh control signal; and selectors corresponding to the first to $N^{th}$ channels, and configured to each select one of commands output from the refresh control modules and bypassed commands and to respectively transmit the selected commands to the first to $N^{th}$ core memories, according to the command selection signals.

The bypassed commands may be normal commands other than the refresh commands that do not pass through the refresh control circuits.

According to an exemplary embodiment of the inventive concept, a memory system includes a memory controller; first to $N^{th}$ core memories configured to communicate with the memory controller via first to $N^{th}$ independent channels, wherein N denotes an integer which is equal to or greater than '2'; and a buffer memory configured to transmit commands and data to be exchanged between the memory controller and the first to $N^{th}$ core memories.

The buffer memory deconcentrates refresh commands corresponding to the first to $N^{th}$ core memories that are input to the buffer memory via the first to $N^{th}$ channels by skipping or delaying transmission of a refresh command among the refresh commands to one of the core memories based on a number of commands input during a specific period.

According to an exemplary embodiment of the inventive concept, memory system includes a system-on-chip (SoC); first to $N^{th}$ core memories configured to communicate with the SoC via first to $N^{th}$ independent channels, wherein N denotes an integer which is equal to or greater than '2'; a buffer memory configured to transmit commands and data to be exchanged between the SoC and the first to $N^{th}$ core memories; and an interposer configured to electrically connect the SoC and the buffer memory to each other.

The buffer memory selectively deconcentrates refresh commands corresponding to the first to $N^{th}$ core memories, based on a number of commands input via the first to $N^{th}$ channels.

In an exemplary embodiment, the buffer memory count a number of all commands received via the first to $N^{th}$ channels during a specific period to generate a count value, and compares the count value with a threshold to determine whether the refresh commands are to be deconcentrated.

In an exemplary embodiment, the buffer memory counts a number of refresh the commands received via the first to $N^{th}$ channels during a specific period to generate a count value, and compares the count value with a threshold to determine whether the refresh commands are to be deconcentrated.

According to an exemplary embodiment of the inventive concept, a memory device includes a buffer and a plurality of memories. The buffer is to receive commands from a memory controller via a plurality of channels. The memories are stacked on top of the buffer and connected to the buffer memory through silicon vias. Each channel is associated with a different one of the second memories, and a corresponding one of the commands transmitted across one of the channels is associated with the corresponding second memory. The buffer skips or delays transmission of a refresh command among the received commands to one of the memories based on a number of the received commands input during a specific period.

In an embodiment, the buffer counts a number of the commands received during the specific period to generate a count value, skips or delays transmission of the refresh command to the one memory when the count value exceeds a preset threshold, and transmits the refresh command to the one memory without skipping or delay when the count value does not exceed the preset threshold.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EXEMPLARY EMBODIMENTS

Figure 1:
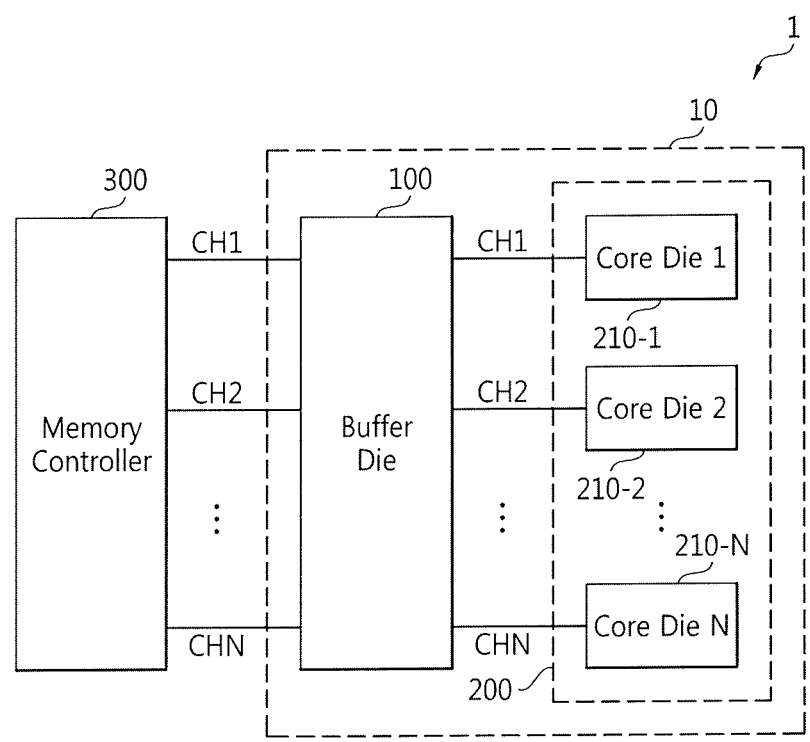
FIG. 1 is a schematic block diagram of a memory system according to an exemplary embodiment of the inventive concept.

The inventive concept now will be described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. As used herein, the singular forms "a", "an" and "the" are intended to include the plural forms as well, unless the context clearly indicates otherwise.

Figure 2:
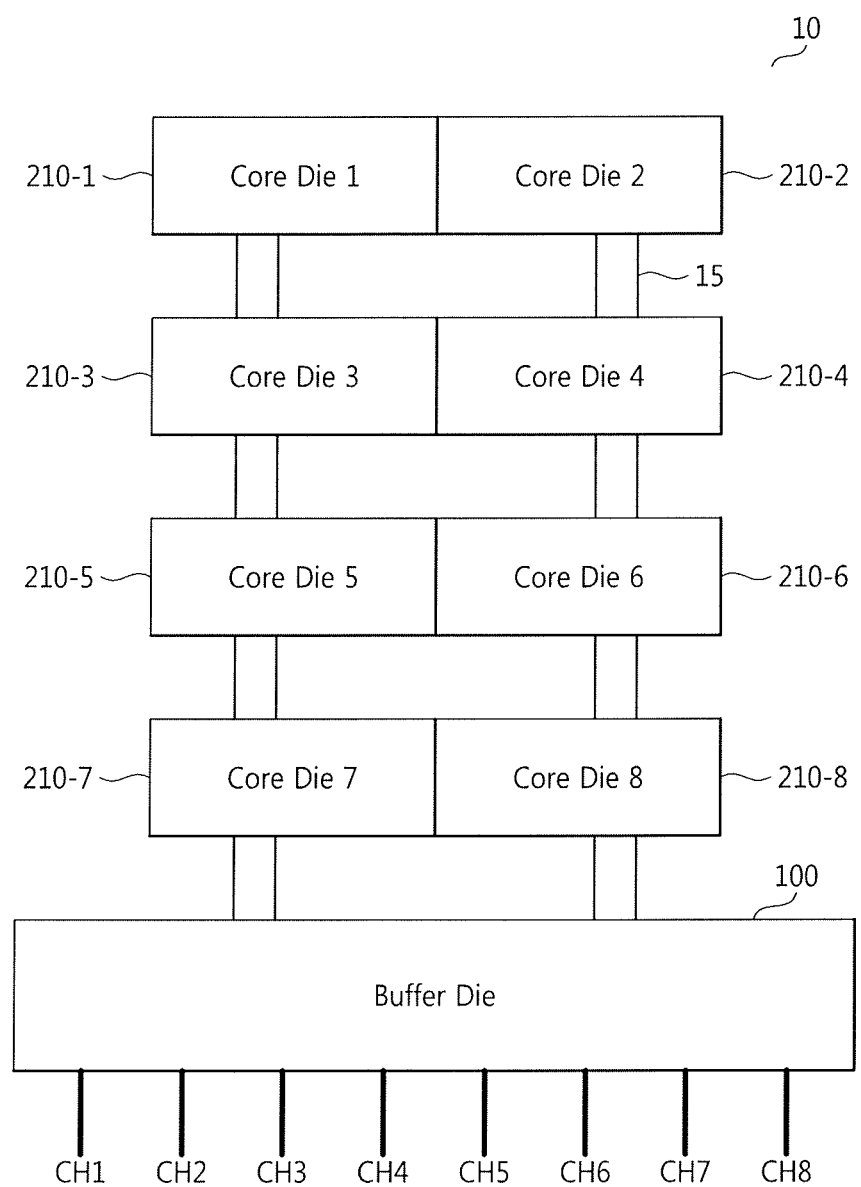
FIG. 2 is a diagram illustrating the structure of a memory device of FIG. 1 according to an exemplary embodiment of the inventive concept.

FIG. 1 is a schematic block diagram of a memory system 1 according to an exemplary embodiment of the inventive concept. FIG. 2 is a diagram illustrating the structure of a memory device 10 of FIG. 1 according to an exemplary embodiment of the inventive concept.

Referring to FIGS. 1 and 2, the memory system 1 includes the memory device 10 and a memory controller 300. The memory device 10 includes a buffer-die 100 (e.g., a buffer memory) and a core-die unit 200 including first to $N^{th}$ core-dies 210-1 to 210-N. Here, 'N' denotes an integer that is equal to or greater than '2'. A die is a small block of semiconducting material, on which a given functional circuit is fabricated. Typically, integrated circuits are produced in large batches on a single wafer of electronic-grade silicon (EGS) or other semiconductor through processes such as photolithography. The wafer is cut ("diced") into many pieces ("dies"), each containing one copy of a circuit. In an embodiment, the buffer-die 100 is a die containing a buffer, a buffer circuit or a buffer memory. In an embodiment, the core-die unit 200 is a circuit including several core-dies 210-1 to 210-N, where each core-die is an integrated circuit.

The first to $N^{th}$ core-dies 210-1 to 210-N may respectively communicate with the memory controller 300 via independent channels CH1 to CHN. In an embodiment, the first to $N^{th}$ core-dies 210-1 to 210-N do not communicate directly with the memory controller 300, and instead communicate indirectly with the memory controller 300 via the buffer-die 100.

Each of the first to $N^{th}$ core-dies 210-1 to 210-N may be referred to as a core memory, and includes a plurality of memory cells (not shown) and an access circuit (not shown) for writing data to and reading data from the plurality of memory cells. The access circuit of each of the first to $N^{th}$ core-dies 210-1 to 210-N includes a circuit for refreshing the plurality of memory cells. In an embodiment, the refreshing of the memory cells involves periodically reading information from the cells and then rewriting the read information to the cells without modification, for the purpose of preserving the information.

The first to $N^{th}$ core-dies 210-1 to 210-N may correspond to the first to $N^{th}$ channels CH1 to CHN in a 1:1 manner. That is, an $i^{th}$ core-die 210-$i$ may correspond to an $i^{th}$ channel CHi. Here, 'i' denotes an integer from '1' to N.

That a core-die and a channel correspond to each other means that signals related to the first to $N^{th}$ core-dies 210-1 to 210-N (e.g., address information ADD, a command CMD, a data signal DQ, and a data strobe signal DQS) are transmitted/received via the first to $N^{th}$ channels CH1 to CHN corresponding to the first to $N^{th}$ core-dies 210-1 to 210-N.

In an exemplary embodiment, the core-dies 210-1 to 210-N correspond to the channels CH1 to CHN in a 1:n manner or an m:1 manner other than the 1:1 manner. Here, 'n' and 'm' each denote an integer.

Each of the first to $N^{th}$ core-dies 210-1 to 210-N may receive the address information ADD and the command CMD from the memory controller 300 and operate according to the address information ADD and the command CMD, and exchange the data signal DQ and the data strobe signal DQS with the memory controller 300, via a corresponding channel among the first to $N^{th}$ channels CH1 to CHN.

The buffer-die 100 may be referred to as a buffer memory (or a buffer), and transmit commands and data to be exchanged between the memory controller 300 and the first to $N^{th}$ core-dies 210-1 to 210-N.

That is, the buffer-die 100 receives commands and data from the memory controller 300 and transmits the commands and data to the core-dies 210-1 to 210-N via the channels CH1 to CHN, and receives data from the core-dies 210-1 to 210-N and transmits the data to the memory controller 300.

In an embodiment, the buffer-die 100 deconcentrates refresh commands for the first to $N^{th}$ core-dies 210-1 to 210-N by selectively delaying or skipping the refresh commands. Here, the delaying of the refresh commands should be understood as artificially delaying when the refresh commands received from the memory controller 300 are to be respectively transmitted to the first to $N^{th}$ core-dies 210-1 to 210-N, and the skipping of the refresh command should be understood as not transmitting the refresh commands received from the memory controller 300 to the first to $N^{th}$ core-dies 210-1 to 210-N, as will be described in detail below.

The memory controller 300 may control overall operations of the memory device 10, e.g., a read operation, a write operation, or a refresh operation, and be embodied as a part of a system-on-chip (SoC) or an application processor (AP).

Referring to FIG. 2, the memory device 10 according to an exemplary embodiment of the inventive concept has a three-dimensional (3D) stack structure.

FIG. 2 illustrates that the memory device 10 includes the buffer-die 100 and eight core-dies 210-1 to 210-8 (i.e., N=8). It is assumed that 'N' is '8' in exemplary embodiments to be described below. However, the number N of the core-dies may higher or lower than 8 in exemplary embodiments of the inventive concept.

The buffer-die 100 and the first to eighth core-dies 210-1 to 210-8 may have a stack structure, in which they are stacked to overlap one other.

For example, as illustrated in FIG. 2, the buffer-die 100 may be located on the bottom of the memory device 10, the first and second core-dies 210-1 and 210-2 may be stacked on the buffer-die 100, the third and fourth core-dies 210-3 and 210-4 may be stacked on the first and second core-dies 210-1 and 210-2, the fifth and sixth core-dies 210-5 and 210-6 may be stacked on the third and fourth core-dies 210-3 and 210-4, and the seventh and eighth core-dies 210-7 and 210-8 may be stacked on the fifth and sixth core-dies 210-5 and 210-6.

Each of the first to eighth core-dies 210-1 to 210-8 may be electrically connected to adjacent core-dies among the first to eighth core-dies 210-1 to 210-8 via a through-silicon via (TSV) 15 containing a conductive material such as copper (Cu), etc.

The buffer-die 100 may include a plurality of logic units (e.g., circuits) to exchange a signal with the memory controller 300 via the first to eighth channels CH1 to CH8 and to perform a request from the memory controller 300 (e.g., a read or write operation). The structure and operation of the buffer-die 100 will be described in detail with reference to FIG. 3 below.

Figure 3:
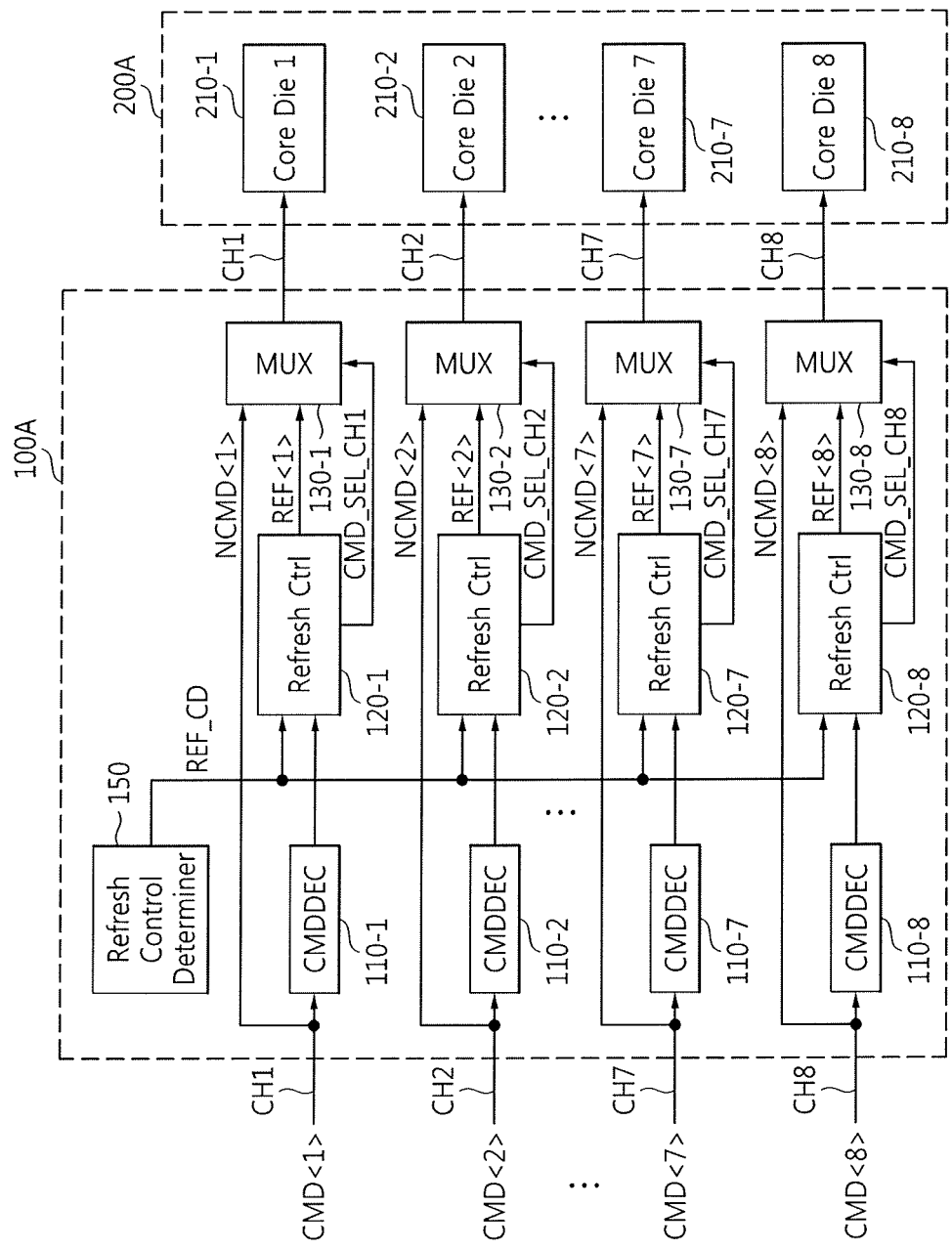
FIG. 3 is a block diagram of a buffer-die according to an exemplary embodiment of the inventive concept.

FIG. 3 is a block diagram of a buffer-die 100A according to an exemplary embodiment of the inventive concept.

Referring to FIG. 3, the buffer-die 100A includes first to eighth command decoders CMDDEC 110-1 to 110-8, first to eighth refresh control (refresh Ctrl) modules 120-1 to 120-8, first to eighth selectors 130-1 to 130-8, and a refresh control determiner 150. In an embodiment, the command decoders CMDDEC 110-1 to 110-8 are decoding circuits such as instruction decoders, the refresh control modules 120-1 to 120-8 are circuits designed to refresh memory cells of the core-dies 210-1 to 210-8, and the selectors 130-1 to 130-8 are multiplexers.

The first to eighth command decoders 110-1 to 110-8, the first to eighth refresh control modules 120-1 to 120-8, and the first to eighth selectors 130-1 to 130-8 correspond to first to eighth channels CH1 to CH8 in a 1:1 manner.

The first to eighth command decoders 110-1 to 110-8 receive commands CMD<1> to CMD<8> from the first to eighth channels CH1 to CH8, decode the commands CMD<1> to CMD<8>, and output command selection signals CMD_SEL_CH1 to CMD_SEL_CH8 according to whether the decoded commands CMD<1> to CMD<8> are refresh commands.

The first to eighth refresh control modules 120-1 to 120-8 respectively delay or skip refresh commands corresponding to the first to eighth channels CH1 to CH8, i.e., refresh commands received from the command decoders 110-1 to 110-N, according to a refresh control signal REF_CD.

In an embodiment, the first to eighth refresh control modules 120-1 to 120-8 delay or skip the refresh commands corresponding to the first to eighth channels CH1 to CH8 when the refresh control signal REF_CD is in an enabled state (for example, when the refresh control signal REF_CD is '1'), and directly output the refresh commands corresponding to the first to eighth channels CH1 to CH8 without delaying or skipping the refresh commands when the refresh control signal REF_CD is in a disabled state (for example, when the refresh control signal REF_CD is '0').

In an embodiment, the first to eighth selectors 130-1 to 130-8 each select one of commands REF<1> to REF<8> output from the refresh control modules 120-1 to 120-8 and bypassed commands NCMD<1> to NCMD<8> and respectively transmit the selected commands to the core-dies 210-1 to 210-8, according to the command selection signals CMD_SEL_CH1 to CMD_SEL_CH8.

The bypassed commands NCMD<1> to NCMD<8> are commands that are not refresh commands and that do not pass through the command decoders 110-1 to 110-8 or the refresh control modules 120-1 to 120-8 (hereinafter, referred to as normal commands). For example, the normal commands may include write, read, delete, active, and precharge commands.

The refresh control determiner 150 (e.g., a circuit) outputs the refresh control signal REF_CD to control the first to $N^{th}$ refresh control modules 120-1 to 120-N. The refresh control determiner 150 may receive commands CMD<1> to CMD<8> and determine whether to set or clear the refresh control signal REF_CD based on the received commands.

Figure 4:
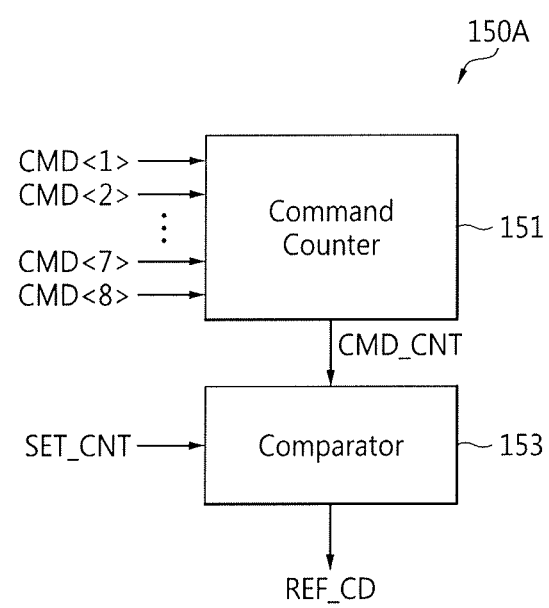
FIG. 4 is a block diagram of a refresh control determiner of FIG. 3 according to an exemplary embodiment of the inventive concept.

FIG. 4 is a block diagram of a refresh control determiner 150A shown in FIG. 3, according to an embodiment of the inventive concept. The refresh control determiner 150A may be used to implement the refresh control determiner 150.

Referring to FIGS. 3 and 4, the refresh control determiner 150A includes a command counter 151 and a comparator 153. The command counter 151 counts the number of commands CMD<1> to CMD<8> received via first to $N^{th}$ channels CH1 to CHN during a specific period to generate a count value CMD_CNT. The comparator 153 compares the count value CMD_CNT with a preset or input threshold SET_CNT to determine whether refresh commands are to be deconcentrated.

For example, the refresh control determiner 150A may set (e.g., enable) a refresh control signal REF_CD to '1' when the count value CMD_CNT of commands input during the specific period is equal to or greater than the preset threshold SET_CNT, and clear (e.g., disable) the refresh control signal REF_CD to '0' when the count value CMD_CNT of commands input during the specific time is less than the preset threshold SET_CNT.

In an exemplary embodiment, the refresh control determiner 150A counts only refresh commands or counts all of commands (e.g., refresh commands, active commands, and precharge commands). In an embodiment, an active command activates an idle bank of memory that causes a read of that row into the bank's array of column sense amplifiers, which is known as "opening" the row. In an embodiment, a precharge command is used to close (deactivate) the row or set the row to an idle state.

In an exemplary embodiment, the refresh control determiner 150A receives and counts commands decoded by the first to $N^{th}$ command decoders 110-1 to 110 to N. For example, the outputs of the first to $N^{th}$ command decoders 110-1 to 110 to N are input to the command decoder 151 instead of the commands CMD<1> to CMD<8>.

Figure 5:
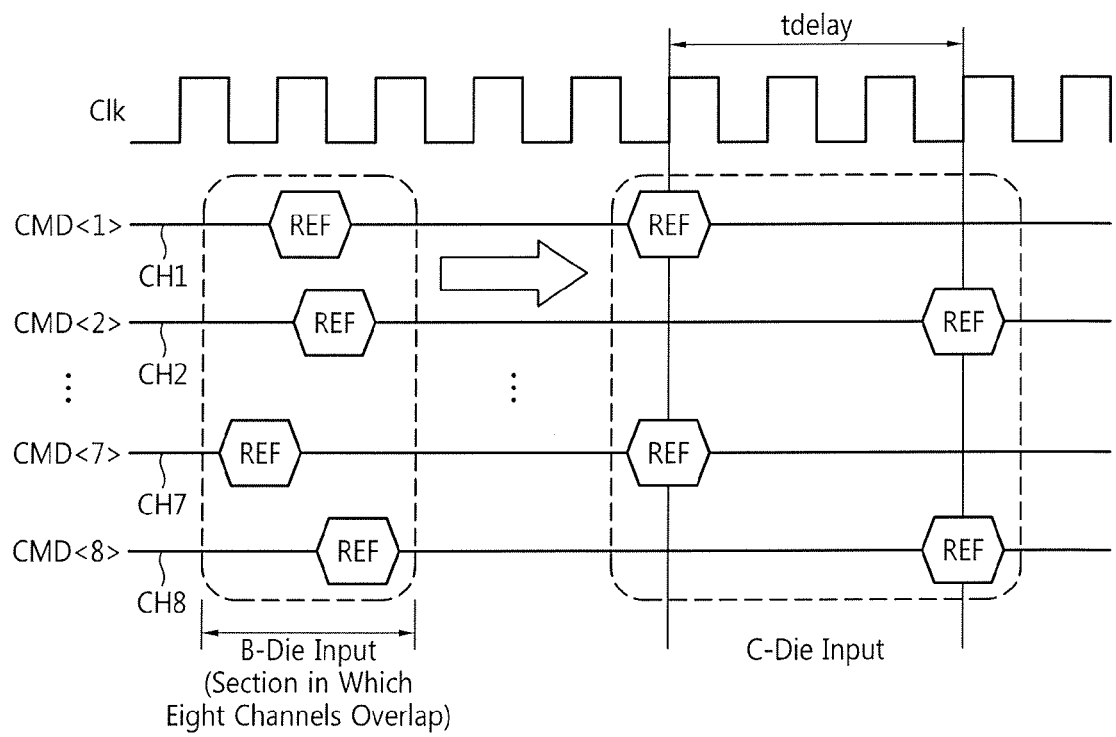
FIG. 5 is a schematic timing diagram of an operation of the buffer-die of FIG. 3 according to an exemplary embodiment of the inventive concept.

FIG. 5 is a schematic timing diagram of an operation of the buffer-die 100A of FIG. 3 according to an exemplary embodiment of the inventive concept.

Referring to FIGS. 3 and 5, the refresh control determiner 150 of the buffer-die 100A may set the refresh control signal REF_CD to '1' when the count value CMD_CNT of the refresh commands input during the specific period is equal to or greater than the preset threshold SET_CNT.

Then, the first to $N^{th}$ refresh control modules 120-1 to 120-N respectively delay refresh commands REF<1> to REF<N> corresponding to channels according to the refresh control signal REF_CD. The refresh commands REF<1> to REF<N> may be delayed for delay periods by the first to $N^{th}$ refresh control modules 120-1 to 120 to N that are equal to or greater than '0' and may be different from one another. For example, some of the refresh commands may be delayed for delay periods greater than '0' while the rest of the refresh commands are not delayed at all.

In the embodiment of FIG. 5, refresh commands REF corresponding to the second channel CH2 and the eighth channel CH8 are delayed for a longer delay period (e.g., tdelay) than refresh commands REF corresponding to the other channels.

The first to $N^{th}$ selectors 130-1 to 130-N respectively transmit the refresh commands REF<1> to REF<N> output from the first to $N^{th}$ refresh control modules 120-1 to 120-N to the core-dies 210-1 to 210-N, according to command selection signals CMD_SEL_CH1 to CMD_SEL_CHN corresponding thereto.

Normal commands NCMD<1> to NCMD<N> which are not refresh commands are transmitted to the core-dies 210-1 to 210-N corresponding thereto without being delayed.

As described above, when the number of refresh commands that are input during a specific period is large, refresh commands corresponding to channels may be delayed to deconcentrate the performing of refreshing in the channels, thereby decreasing power noise.

Figure 6A:
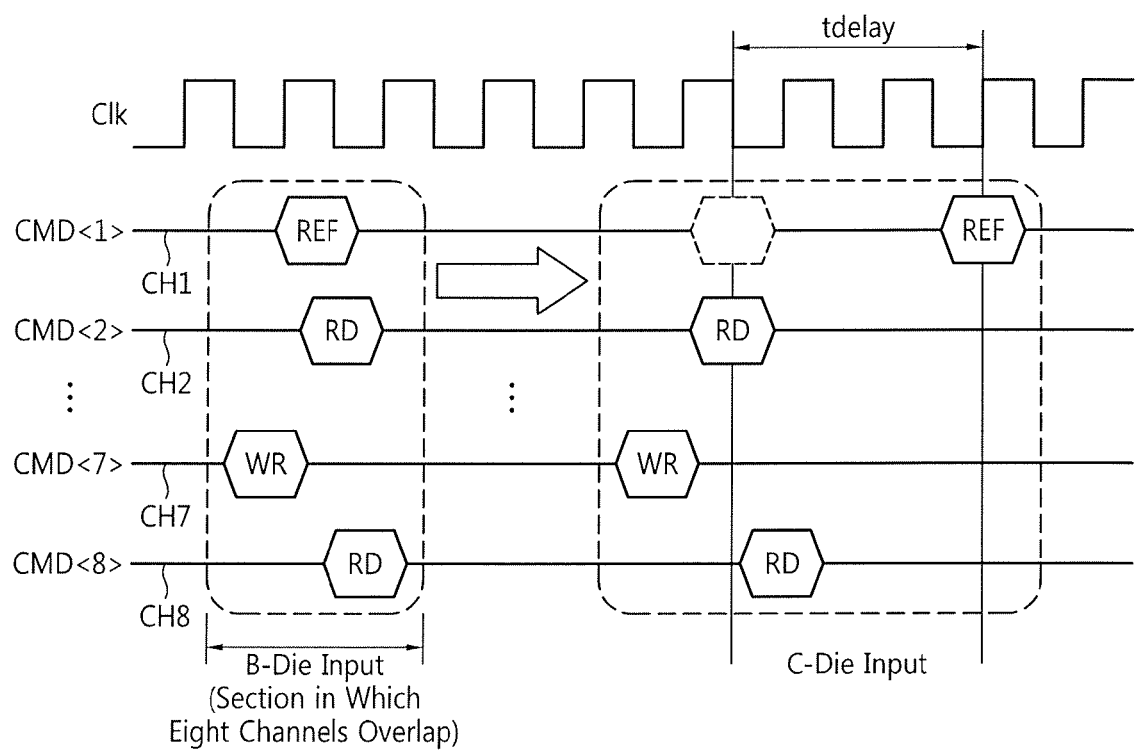
FIG. 6A is a schematic timing diagram of an operation of the buffer-die of FIG. 3 according to an exemplary embodiment of the inventive concept.

FIG. 6A is a schematic timing diagram of an operation of the buffer-die 100A of FIG. 3 according to an exemplary embodiment of the inventive concept.

Referring to FIGS. 3 and 6A, the refresh control determiner 150 of the buffer-die 100A may set the refresh control signal REF_CD to '1' when the number of all commands input during a specific period is equal to or greater than the preset threshold SET_CNT.

Then, the first to $N^{th}$ refresh control modules 120-1 to 120-N respectively delay refresh commands REF<1> to REF<N> corresponding to channels according to the refresh control signal REF_CD. The refresh commands REF<1> to REF<N> may be delayed for delay periods by the first to $N^{th}$ refresh control modules 120-1 to 120-N that are equal to or greater than '0' and may be different from one another. For example, some of the refresh commands may be delayed for delay periods greater than '0' while the rest of the refresh commands are not delayed at all.

In the embodiment of FIG. 6A, only refresh commands REF are delayed by the refresh control modules 120-1 to 120-N, and normal commands NCMD<1> to NCMD<N> which are not refresh commands are respectively transmitted to the core-dies 210-1 to 210-N without being delayed.

Figure 6B:
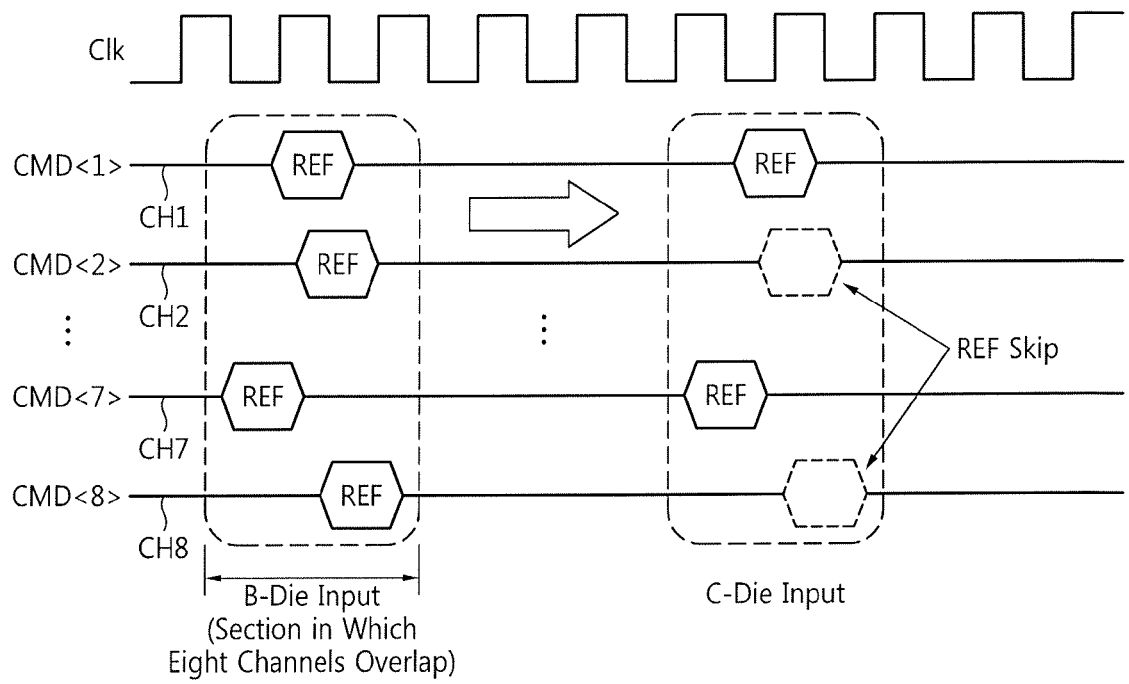
FIG. 6B is a schematic timing diagram of an operation of the buffer-die of FIG. 3 according to an exemplary embodiment of the inventive concept.

FIG. 6B is a schematic timing diagram of an operation of the buffer-die of FIG. 3 according to an exemplary embodiment of the inventive concept.

Referring to FIGS. 3 and 6B, the refresh control determiner 150 of the buffer-die 100A may set the refresh control signal REF_CD to '1' when the number of refresh commands that are input during a specific period is equal to or greater than the preset threshold SET_CNT.

Then, the first to $N^{th}$ refresh control modules 120-1 to 120-N may skip delay refresh commands REF<1> to REF<N> corresponding to at least one channel according to the refresh control signal REF_CD.

In the embodiment of FIG. 6B, refresh commands REF corresponding to the first channel CH1 and the seventh channel CH7 are respectively transmitted to the corresponding core-dies 210-1 and 210-7 without being skipped. On the other hand, refresh commands REF corresponding to the second channel CH2 and the eighth channel CH8 are skipped and are not transmitted to the corresponding core-dies 210-2 and 210-8. In an embodiment, when the refresh control signal REF_CD is set to '1', the even refresh commands are transmitted to the corresponding core-dies and the odd refresh commands are skipped or delayed, or the odd refresh commands are transmitted to the corresponding core-dies and the even refresh commands are skipped or delayed.

Figure 6C:
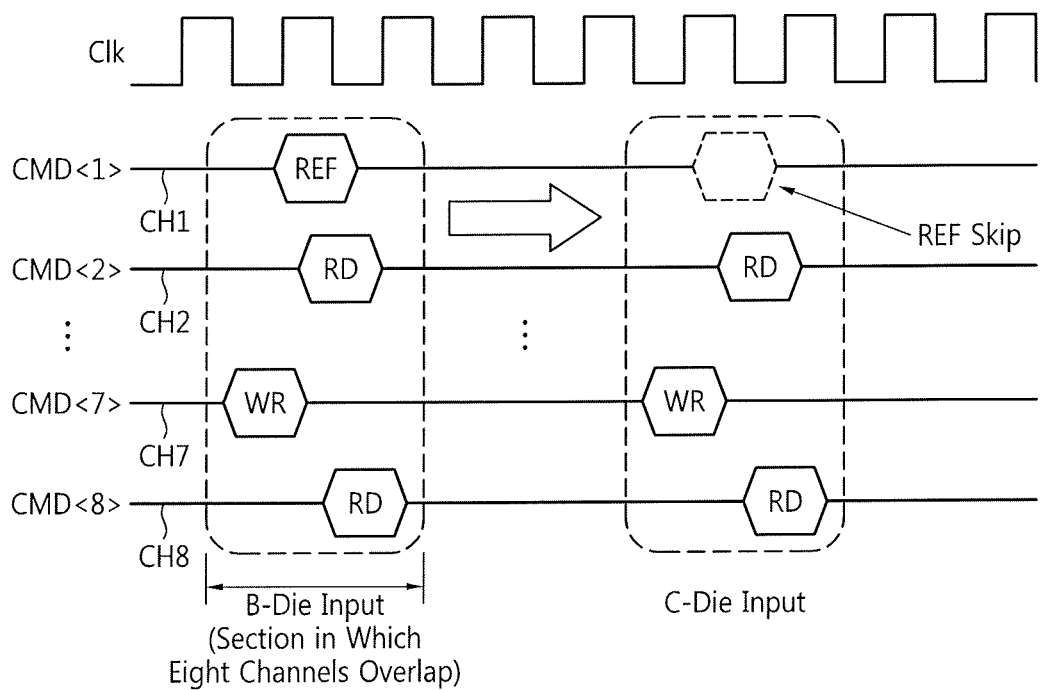
FIG. 6C is a schematic timing diagram of an operation of the buffer-die of FIG. 3 according to an exemplary embodiment of the inventive concept.

FIG. 6C is a schematic timing diagram of an operation of the buffer-die of FIG. 3 according to an exemplary embodiment of the inventive concept;

Referring to FIGS. 3 and 6C, the refresh control determiner 150 of the buffer-die 100A may set the refresh control signal REF_CD to '1' when the number of all commands input during a specific period is equal to or greater than the preset threshold SET_CNT.

Then, the first to $N^{th}$ refresh control modules 120-1 to 120-N may skip delay refresh commands REF<1> to REF<N> corresponding to at least one channel according to the refresh control signal REF_CD.

In the embodiment of FIG. 6C, refresh commands REF corresponding to the first channel CH1 are not transmitted to the corresponding core-die 210-1. On the other hand, normal commands NCMD<1> to NCMD<N>, for example, a read command RD and a write command WR which are not refresh commands are respectively transmitted to the core-dies 210-1 to 210-N without being delayed or skipped.

As described above, in the memory device 10 including the buffer-die 100 and the core-dies 210-1 to 210-N, different independent channels CH1 to CHN are allocated to the core-dies 210-1 to 210-N. Since all of the channels CH1 to CHN operate independently, there is no correlation between adjacent channels.

Thus, refresh commands may be simultaneously input to all of the channels CH1 to CHN or may be input to all of the channels CH1 to CHN during a specific period. In this case, a large amount of peak noise may occur.

When a refresh operation during which the intensity of peak noise is highest is substantially performed in all channels among operations of the memory device 10, thermal and core characteristics of the memory device 10 may be degraded.

According to an exemplary embodiment of the inventive concept, refresh commands are selectively deconcentrated to decrease peak noise occurring due to concentration of the refresh commands.

According to an exemplary embodiment of the inventive concept, a degree of concentration of commands or refresh commands input to the buffer-die 100 (e.g., the number of commands or refresh commands input to the buffer-die 100 during a specific period) may be counted and then refresh commands to be input to core-dies may be controlled (for example, delayed or skipped) based on the degree of concentrations of the input commands or refresh commands, thereby effectively decreasing power noise.

Figure 7:
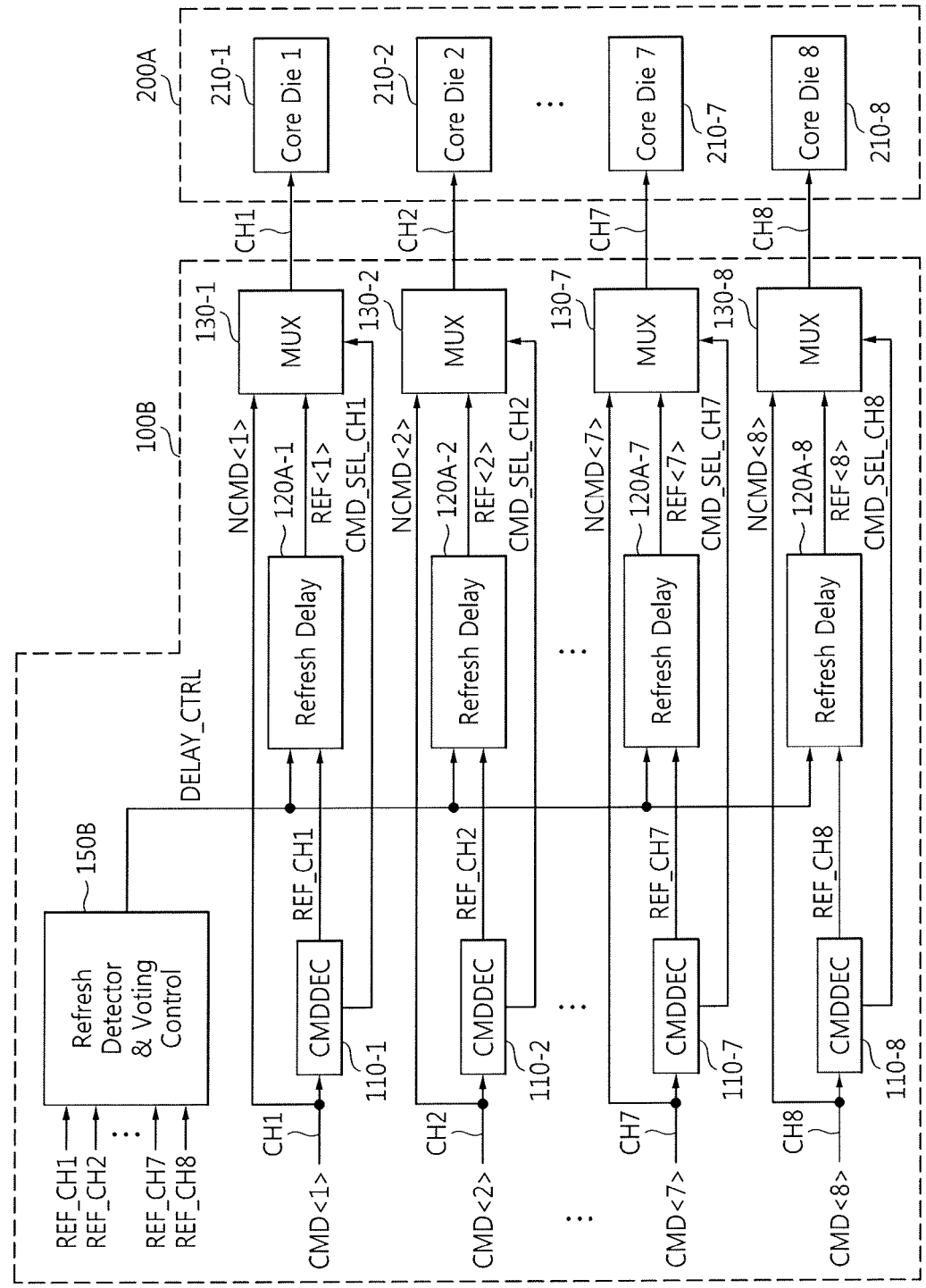
FIG. 7 is a block diagram of a buffer-die according to an exemplary embodiment of the inventive concept.

FIG. 7 is a block diagram of a buffer-die 100B according to an exemplary embodiment of the inventive concept.

Referring to FIG. 7, the buffer-die 100B includes first to eighth command decoders CMDDEC 110-1 to 110-8, first to eighth refresh delay modules 120A-1 to 120A-8, first to eighth selectors 130-1 to 130-8, and a refresh detector & voting controller 150B (e.g., a circuit).

The buffer-die 100B of FIG. 7 is similar to the buffer-die 100A of FIG. 3 in terms of structure and operation and thus primarily the differences therebetween will be discussed below.

The first to eighth refresh delay modules 120A-1 to 120A-8 respectively delay refresh commands corresponding to channels, i.e., refresh commands output from the command decoders 110-1 to 110-8 corresponding thereto, according to a refresh delay control signal DELAY_CTRL. The refresh commands may be delayed for delay periods by the first to eighth refresh delay modules 120A-1 to 120A-8, which may be set beforehand.

The first to eighth refresh delay modules 120A-1 to 120A-8 may delay the refresh commands corresponding to the channels when the refresh delay control signal DELAY_CTRL is in an enabled state (e.g., the refresh delay control signal DELAY_CTRL is '1'), and may directly output the refresh commands without delaying the refresh commands when the refresh delay control signal DELAY_CTRL is in a disabled state (e.g., the refresh delay control signal DELAY_CTRL is '0').

The first to eighth selectors 130-1 to 130-8 each select one of commands REF<1> to REF<N> output from the refresh delay modules 120-1 to 120 to 8 and bypassed commands NCMD<1> to NCMD<N> and respectively transmit selected commands to the core-dies 210-1 to 210-8, according to command selection signals CMD_SEL_CH1 to CMD_SEL_CH8.

The refresh detector & voting controller 150B is an embodiment of the refresh control determiner 150 of FIG. 3, and outputs the refresh delay control signal DELAY_CTRL for controlling the first to eighth refresh delay modules 120A-1 to 120A-8.

In an exemplary embodiment, the refresh detector & voting controller 150B determines whether the number of refresh commands received via first to eighth channels CH1 to CH8 during a specific period is equal to or greater than a preset threshold to determine whether the refresh commands are to be delayed.

Figures 8A, 8B:
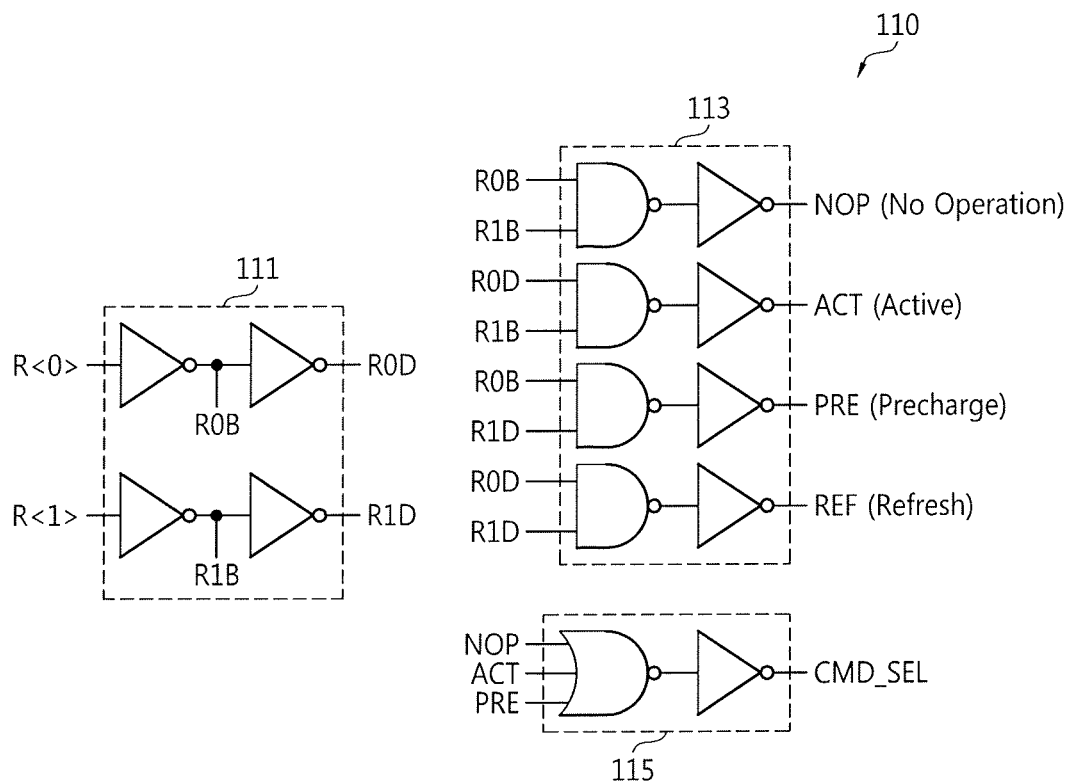
FIG. 8A is a circuit diagram of a command decoder of FIG. 7 according to an exemplary embodiment of the inventive concept.
FIG. 8B is a table illustrating an operation of the command decoder of FIG. 8A.

FIG. 8A is a circuit diagram of a command decoder 110 shown in FIG. 7, according to an exemplary embodiment of the inventive concept. FIG. 8B is a table illustrating an operation of the command decoder 110 of FIG. 8A.

Referring to FIGS. 7, 8A, and 8B, each of the first to eighth command decoders 110-1 to 110-8 of FIG. 7 may be embodied to be substantially the same as the command decoder 110 of FIG. 8A.

In an exemplary embodiment, it is assumed that each of the commands CMD<1> to CMD<8> input via the respective channels CH1 to CH8 is a 2-bit signal and decoded commands are divided into four commands. However, exemplary embodiments of the inventive concept are not limited thereto. In an exemplary embodiment, each of the commands CMD<1> to CMD<8> may be a 3 or more bit signal or may be a packet signal.

It is assumed that the 2-bit signal constituting each of the commands CMD<1> to CMD<8> includes first and second command input signals R<0> and R<1>. The command decoder 110 receives the first and second command input signals R<0> and R<1> and outputs one of four decoded commands NOP, ACT (e.g., an active command), PRE (e.g., a precharge command), and REF (e.g., a refresh command).

The command decoder 110 includes an input-signal receiver 111 and a decoding unit 113 (e.g., a decoder or decoding circuit). The command decoder 110 further includes a command selection signal generator 115 configured to generate a command selection signal CMD_SEL.

The input-signal receiver 111 receives first and second command input signals R<0> and R<1> corresponding to a channel, and outputs inverted input signals R0B and R1B and delayed input signals R0D and R1D. In an embodiment, the input-signal receiver 111 includes a first pair of inverters connected in series for receiving the first command input signal R<0> and a second pair of inverters connected in series for receiving the second command input signal R<1>.

The decoding unit 113 may output the decoded commands NOP, ACT, PRE, and REF according to the table of FIG. 8B.

For example, the decoding unit 113 may output the no-operation command NOP when the first and second command input signals R<0> and R<1> are both logic low (L), output the active command ACT when the first and second command input signals R<0> and R<1> are respectively logic high (H) and logic low (L), output the precharge command PRE when the first and second command input signals R<0> and R<1> are respectively logic low (L) and logic high (H), and output the refresh command REF when the first and second command input signals R<0> and R<1> are both logic high (H). In an embodiment, the decoding unit 113 includes a plurality of NAND gates connected in series with respective inverters.

The command selection signal generator 115 generates a command selection signal CMD_SEL that is logic high when a command decoded by the decoding unit 113 is the no-operation command NOP, the active command ACT, or the precharge command PRE, and generates a command selection signal CMD_SEL that is logic low when the command decoded by the decoding unit 113 is the refresh command REF.

Figure 9:
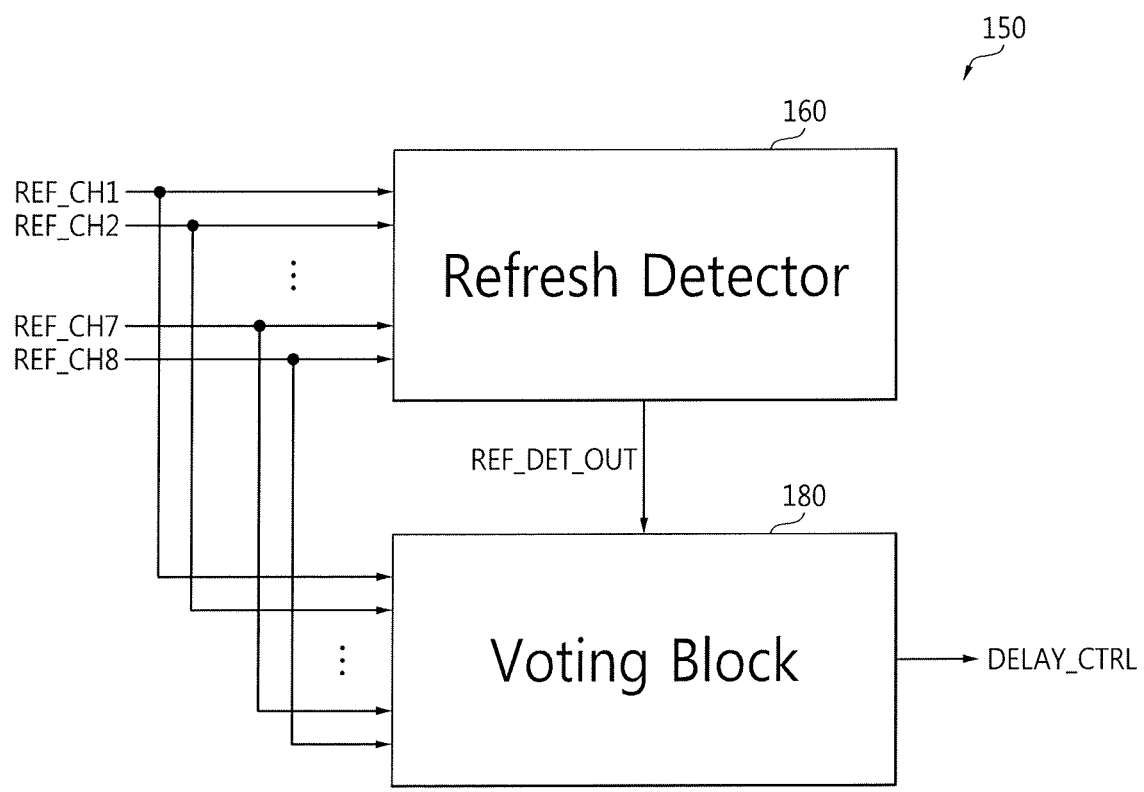
FIG. 9 is a block diagram of a refresh detector & voting controller of FIG. 7 according to an exemplary embodiment of the inventive concept.

FIG. 9 is a block diagram of the refresh detector & voting controller 150B of FIG. 7 according to an exemplary embodiment of the inventive concept. Referring to FIG. 9, the refresh detector & voting controller 150B includes a refresh detector 160 and a voting block 180. The refresh detector 160 and the voting block 180 receive the decoded refresh commands REF_CH1 to REF_CH8. The refresh detector 160 outputs a latch output signal REF_DET_OUT based on the received decoded refresh commands REF_CH1 to REF_CH8. The voting block 180 generates the control signal DELAY_CTRL based on latch output signal REF_DET_OUT based on the received decoded refresh commands REF_CH1 to REF_CH8.

Figure 10A:
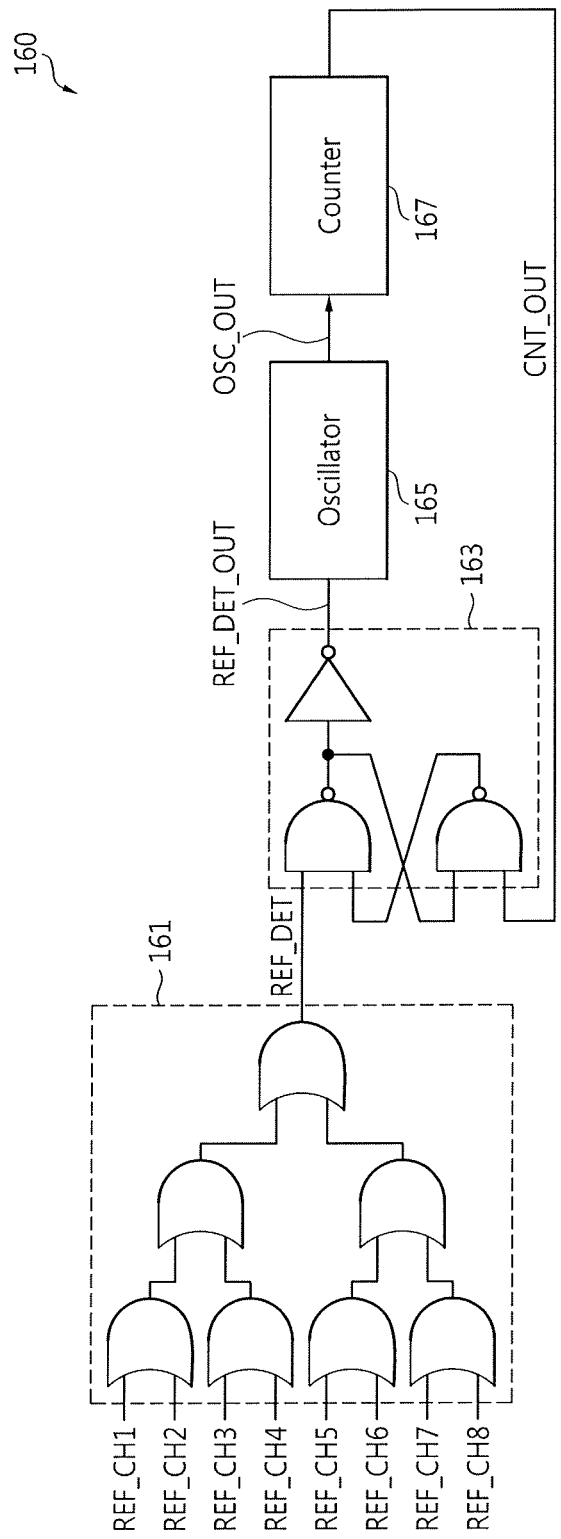
FIG. 10A is a diagram illustrating the structure of a refresh detector of FIG. 9 according to an exemplary embodiment of the inventive concept.
Figure 10B:
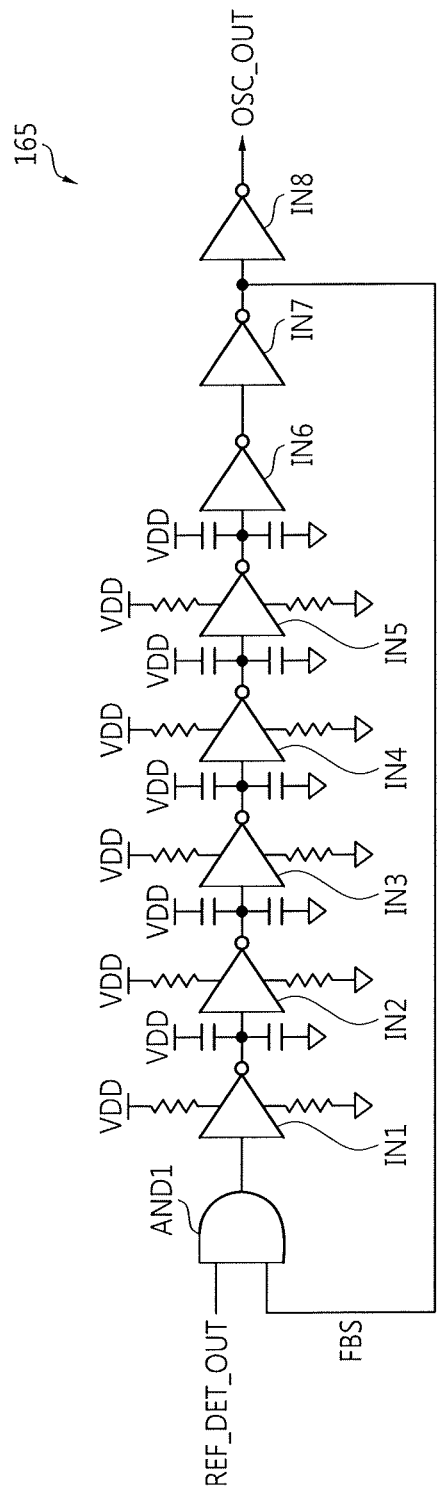
FIG. 10B is a circuit diagram of an oscillator of FIG. 10A according to an exemplary embodiment of the inventive concept.
Figure 11A:
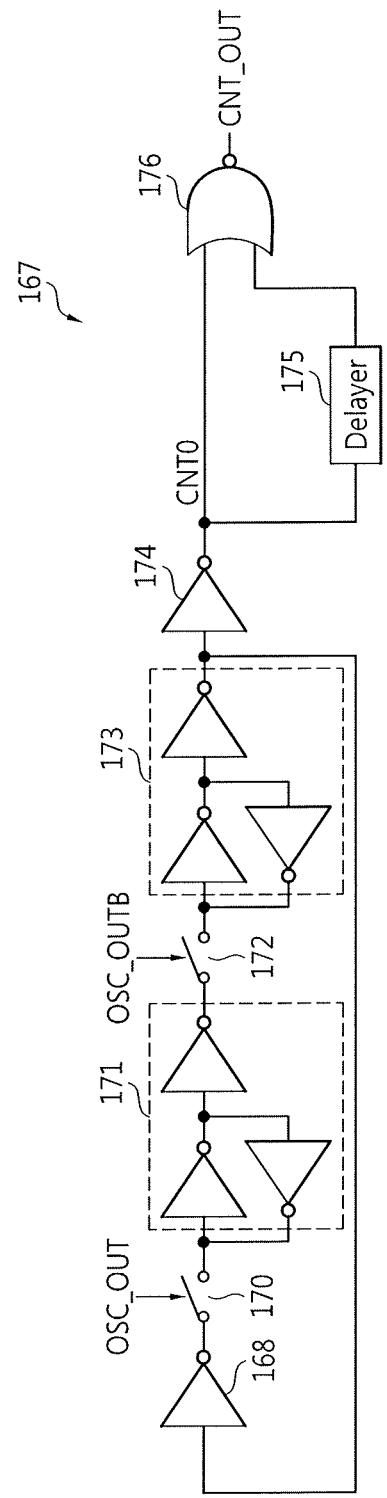
FIG. 11A is a circuit diagram of a counter of FIG. 10A according to an exemplary embodiment of the inventive concept.
Figure 11B:
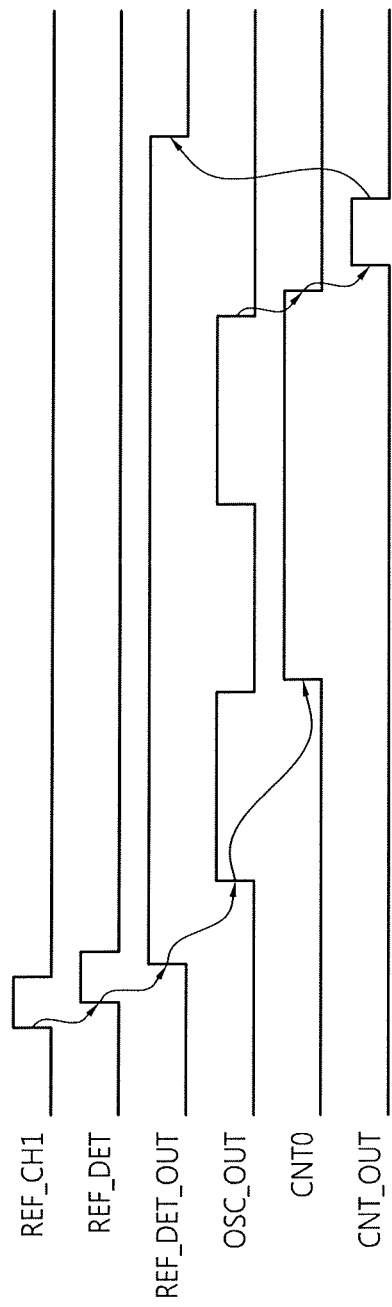
FIG. 11B is a schematic signal timing diagram illustrating an operation of the refresh detector of FIG. 10A.

FIG. 10A is a diagram illustrating the structure of the refresh detector 160 of FIG. 9 according to an exemplary embodiment of the inventive concept. FIG. 10B is a circuit diagram of an oscillator 165 of FIG. 10A according to an exemplary embodiment of the inventive concept. FIG. 11A is a circuit diagram of a counter 167 of FIG. 10A according to an exemplary embodiment of the inventive concept. FIG. 11B is a schematic signal timing diagram illustrating an operation of the refresh detector 160 of FIG. 10A;

Referring to FIGS. 9, 10A, 10B, 11A, and 11B, the refresh detector 160 includes a detection signal generator 161, a set-reset (S-R) latch 163, the oscillator 165, and the counter 167.

The detection signal generator 161 detects whether refresh commands are present or not by receiving decoded refresh commands REF_CH1 to REF_CH8 output from the first to eighth command decoders 110-1 to 110-8 of FIG. 7.

When receiving at least one decoded refresh command among the decoded refresh commands REF_CH1 to REF_CH8 from the first to eighth command decoders 110-1 to 110-8, the detection signal generator 161 may output a refresh detection signal REF_DET that is logic high. In an embodiment, the detection signal generator 161 includes a plurality of OR gates, where a first set of the OR gates receives pairs of the decoded refresh commands REF_CH1 to REF_CH8, a second set of the OR gates receives outputs of the first set, and a last OR gate of the plurality receives outputs of the second set to output the refresh detection signal REF_DET.

According to an exemplary embodiment, the decoded refresh commands REF_CH1 to REF_CH8 may be signals that become logic high (or pulse signals having a logic high level) when both of the first and second command input signals R<0> and R<1> are logic high (H).

Thus, when at least one among the decoded refresh commands REF_CH1 to REF_CH8 output from the first to eighth command decoders 110-1 to 110-8 is logic high, the refresh detection signal REF_DET that is logic high may be output.

The S-R latch 163 latches the refresh detection signal REF_DET and outputs the latch output signal REF_DET_OUT.

The S-R latch 163 may receive the refresh detection signal REF_DET as a set (S) input, and receive a counter output signal CNT_OUT as a reset (R) input.

Thus, the latch output signal REF_DET_OUT may become logic high at a rising edge of the refresh detection signal REF_DET, and be reset to logic low at a falling edge of the counter output signal CNT_OUT.

The oscillator 165 may include an odd number of inverters IN1 to IN7, an output inverter IN8, and an AND gate AND1 which are connected in series as illustrated in FIG. 10B.

The AND gate AND1 performs an AND operation on the latch output signal REF_DET_OUT and a feedback signal FBS and outputs a result of performing the AND operation. The feedback signal FBS is an output signal of the inverter IN7.

The output inverter IN8 inverts the feedback signal FBS and outputs an oscillator output signal OSC_OUT.

The oscillator 165 may be enabled and generate the oscillator output signal OSC_OUT, at a rising edge of the latch output signal REF_DET_OUT. A cycle of the oscillator output signal OSC_OUT may be determined according to resistors and capacitors included in the oscillator 165.

The counter 167 receives the oscillator output signal OSC_OUT and operates in response to the oscillator output signal OSC_OUT.

As illustrated in FIG. 11A, in an exemplary embodiment, the counter 167 includes inverters 168 and 174, first and second switches 170 and 172, first and second latches 171 and 173, an inversion delayer 175, and a NOR gate 176.

The first and second switches 170 and 172 may be respectively closed in response to the oscillator output signal OSC_OUT and an inverted oscillator output signal OSC_OUTB.

The first switch 170 is closed to transmit an output signal of the inverter 168 as an input of the first latch 171 when the oscillator output signal OSC_OUT is logic high. The second switch 172 is closed to transmit an output signal of the first latch 171 as an input of the second latch 173 when the oscillator output signal OSC_OUT is logic low. The inverter 174 inverts an output signal of the second latch 173 and outputs an intermediate count CNT0.

The inversion delayer 175 delays and inverts the intermediate count CNT0, and outputs a result of delaying and inverting the intermediate count CNT0. Although not shown, the inversion delayer 175 may include an odd number of inverters connected in series.

The NOR gate 176 performs a NOR operation on the intermediate count CNT0 and an output signal of the inversion delayer 175 to generate the counter output signal CNT_OUT.

If it is assumed that an initial value of the intermediate count CNT0 of the counter 167 is '0', '0' is input to the first latch 171 when the oscillator output signal OSC_OUT is logic high, and '0' which is an output signal of the first latch 171 is input to the second latch 173 when the oscillator output signal OSC_OUT is logic low. Thus, the intermediate count CNT0 becomes '1'. When the oscillator output signal OSC_OUT is logic high again, '1' is input to the first latch 171. When the oscillator output signal OSC_OUT is logic low again, '1' which is an output signal of the first latch 171 is input to the second latch 173 and thus the intermediate count CNT0 becomes '0'.

An operation of the refresh detector 160 will be described with reference to the signal timing diagram of FIG. 11B below.

As illustrated in FIG. 11B, when a decoded refresh command REF_CH1 is received from the first command decoder 110-1, the refresh detection signal REF_DET becomes logic high for a certain period.

Although FIG. 11B illustrates only the refresh command REF_CH1 corresponding to the first channel CH1, the refresh detection signal REF_DET becomes logic high when any refresh command REF_CH is received via one of the first to eighth channels CH1 to CH8.

The S-R latch 163 latches the refresh detection signal REF_DET and outputs a latch output signal REF_DET_OUT that is logic high.

The oscillator 165 is enabled and generates the oscillator output signal OSC_OUT, at a rising edge of the latch output signal REF_DET_OUT.

The counter 167 may generate an intermediate count CNT0 having a logic-high level section for one cycle of the oscillator output signal OSC_OUT, and outputs a counter output signal CNT_OUT, which is a pulse signal having a logic-high level section for a predetermined period, at a falling edge of the intermediate count CNT0.

The counter output signal CNT_OUT is input as a reset (R) input of the S-R latch 163 and thus the latch output signal REF_DET_OUT is reset to a logic low level at a falling edge of the counter output signal CNT_OUT.

The oscillator 165 and the counter 167 reset the latch output signal REF_DET_OUT. A time when the latch output signal REF_DET_OUT is to be reset may be determined according to one cycle of the oscillator output signal OSC_OUT.

The latch output signal REF_DET_OUT may be input to the voting block 180 to enable the voting block 180.

Figure 12:
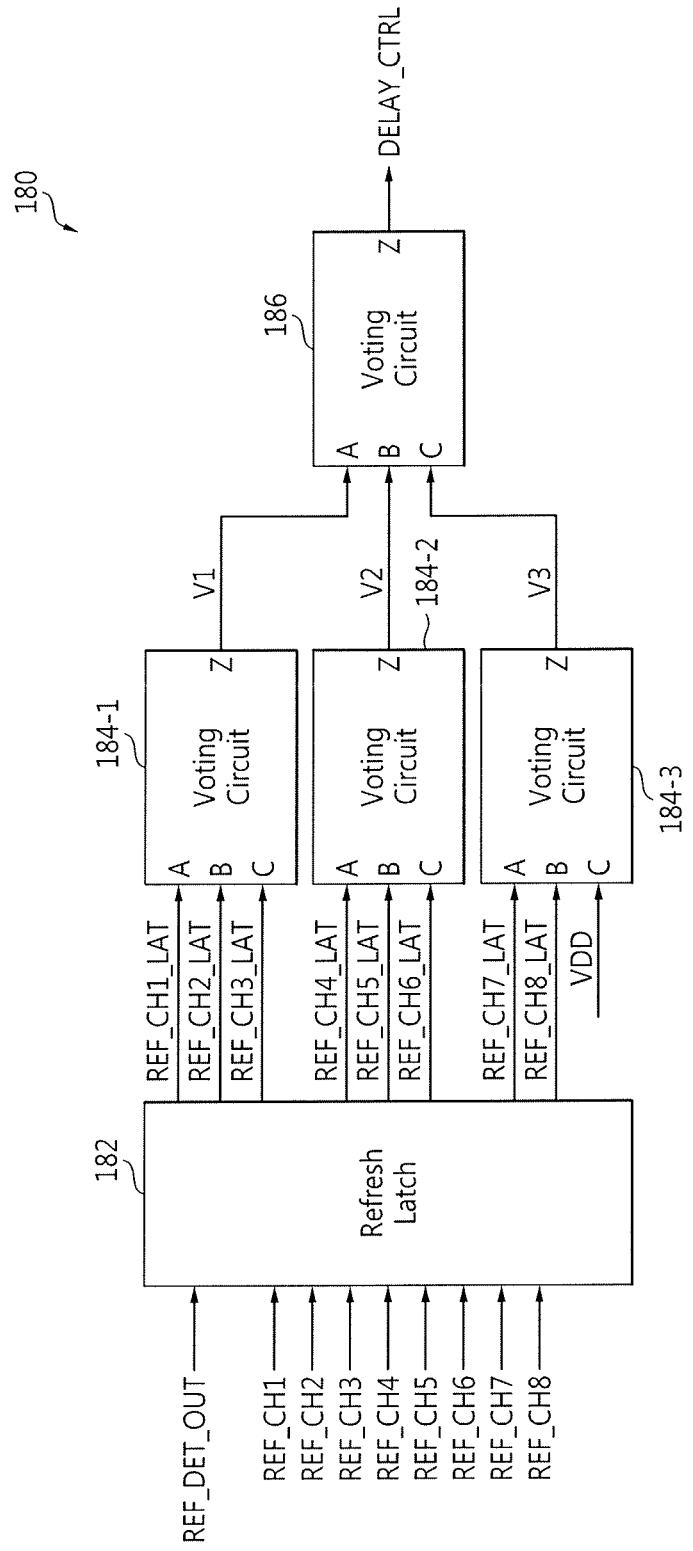
FIG. 12 is a block diagram of a voting block of FIG. 9 according to an exemplary embodiment of the inventive concept.
Figure 13:
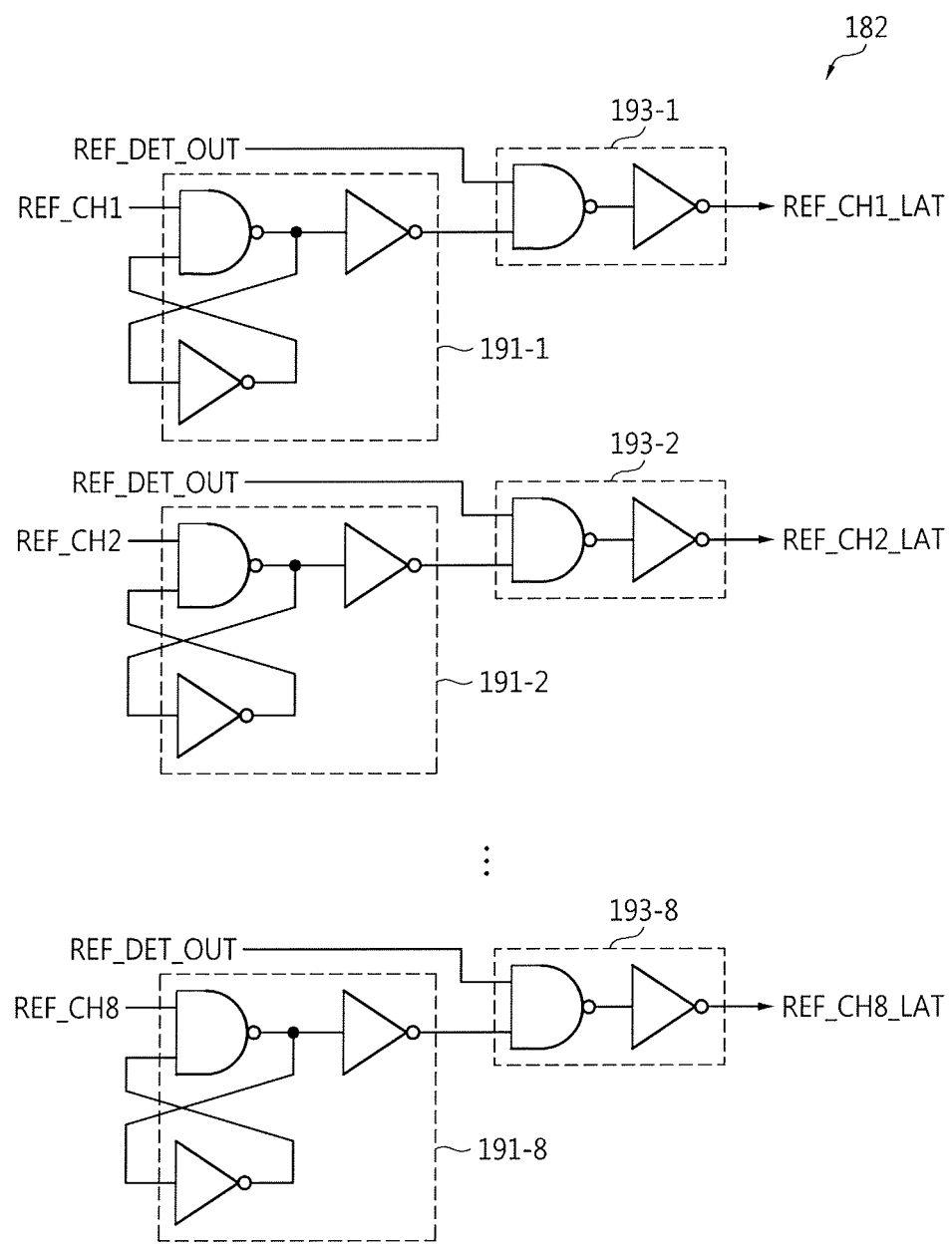
FIG. 13 is a circuit diagram of a refresh latch of FIG. 12 according to an exemplary embodiment of the inventive concept.

FIG. 12 is a block diagram of the voting block 180 of FIG. 9 according to an exemplary embodiment of the inventive concept. FIG. 13 is a circuit diagram of a refresh latch 182 of FIG. 12 according to an exemplary embodiment of the inventive concept.

Referring to FIGS. 9, 12, and 13, the voting block 180 includes the refresh latch 182, and first to fourth voting circuits 184-1, 184-2, 184-3 and 186.

The refresh latch 182 latches first to eighth decoded refresh commands REF_CH1 to REF_CH8 in response to a latch output signal REF_DET_OUT.

The refresh latch 182 includes a plurality of channel latches to latch the decoded refresh commands REF_CH1 to REF_CH8 corresponding to channels.

A first channel latch of the refresh latch 182 is configured to latch the decoded refresh command REF_CH1 corresponding to a first channel. The first channel latch includes an S-R latch 191-1 and an AND element 193-1.

The S-R latch 191-1 latches and outputs the decoded refresh command REF_CH1 corresponding to the first channel. The AND element 193-1 performs an AND operation on the latch output signal REF_DET_OUT and an output signal of the S-R latch 191-1, and outputs a latched refresh command REF_CH1_LAT.

The second though eighth latches of the refresh latch 182 have substantially the same structure as the first channel latch.

The second channel latch includes an S-R latch 191-2 and an AND element 193-2. The S-R latch 191-2 latches and outputs the decoded refresh command REF_CH2 corresponding to a second channel, and the AND element 193-2 performs the AND operation on the latch output signal REF_DET_OUT and an output signal of the S-R latch 191-2 and outputs a latched refresh command REF_CH2_LAT.

The eighth channel latch includes an S-R latch 191-8 and an AND element 193-8. The S-R latch 191-8 latches and outputs the decoded refresh command REF_CH8 corresponding to an eighth channel, and the AND element 193-8 perform the AND operation on the latch output signal REF_DET_OUT and an output signal of the S-R latch 191-8 and outputs a latched refresh command REF_CH8_LAT.

The structures and operations of the other channel latches are substantially the same as those of the first channel latch.

Each of the first to fourth voting circuits 184-1 to 184-3 and 186 may output a logic high signal when at least two signals among three input signals are logic high.

For example, the first voting circuit 184-1 may receive latched refresh commands REF_CH1_LAT, REF_CH2_LAT, and REF_CH3_LAT corresponding to the first to third channels CH1 to CH3, and output a first voting signal V1 that is logic high when at least two signals among the latched refresh command REF_CH1_LAT, REF_CH2_LAT, and REF_CH3_LAT are logic high.

The second voting circuit 184-2 may receive latched refresh commands REF_CH4_LAT, REF_CH5_LAT, REF_CH6_LAT corresponding to fourth to sixth channels CH4 to CH6, and output a second voting signal V2 that is logic high when at least two signals among the latched refresh commands REF_CH4_LAT, REF_CH5_LAT, and REF_CH6_LAT are logic high.

The third voting circuit 184-3 may receive latched refresh command REF_CH7_LAT and REF_CH8_LAT corresponding to seventh and eighth channels CH7 and CH8, and output a third voting signal V3 that is logic high when at least one signal among the latched refresh commands REF_CH7_LAT and REF_CH8_LAT is logic high. In an embodiment, the third voting circuit 184-3 additionally receives a logic high voltage (VDD) as a third input when 3 input voting circuits are used.

The fourth voting circuit 186 may receive the first to third voting signals V1 to V3, and output a refresh delay control signal DELAY_CTRL that is logic high when at least two signals among the first to third voting signals V1 to V3 are logic high.

Thus, the voting block 180 may enable the refresh delay control signal DELAY_CTRL when at least three or four signals among the latched refresh commands REF_CH1_LAT to REF_CH8_LAT corresponding to the first to eighth channels CH1 to CH8 are latched.

However, the number of refresh commands latched to enable the refresh delay control signal DELAY_CTRL among the refresh commands REF_CH1_LAT to REF_CH8_LAT may vary in alternate embodiments of the invention.

As described above, according to an exemplary embodiment of the inventive concept, the refresh delay control signal DELAY_CTRL may be enabled when the number of refresh commands input to the first to eighth channels CH1 to CH8 during a specific period is equal to or greater than a predetermined threshold.

Figure 14:
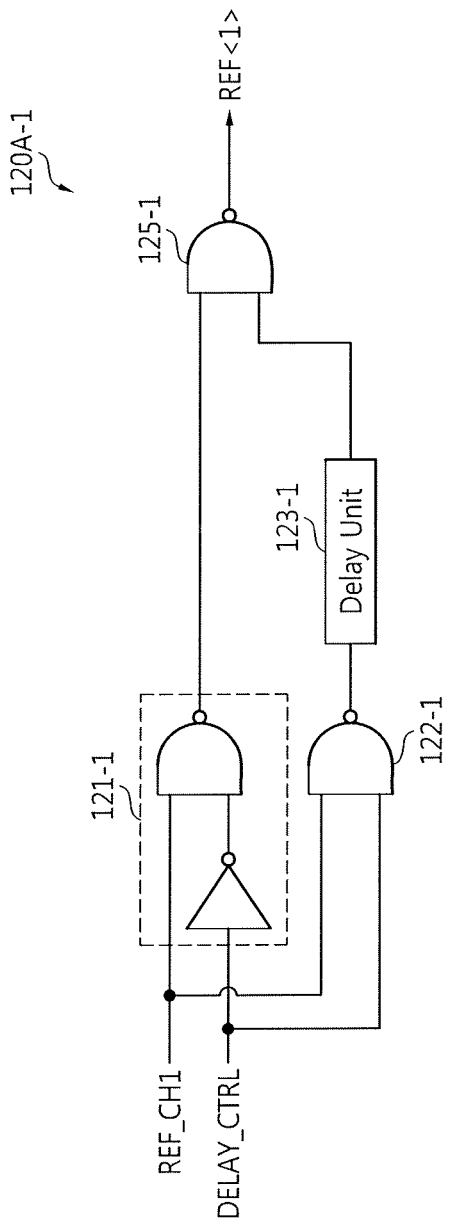
FIG. 14 is a diagram illustrating a first refresh delay module shown in FIG. 7, according to an exemplary embodiment of the inventive concept.
Figure 15:
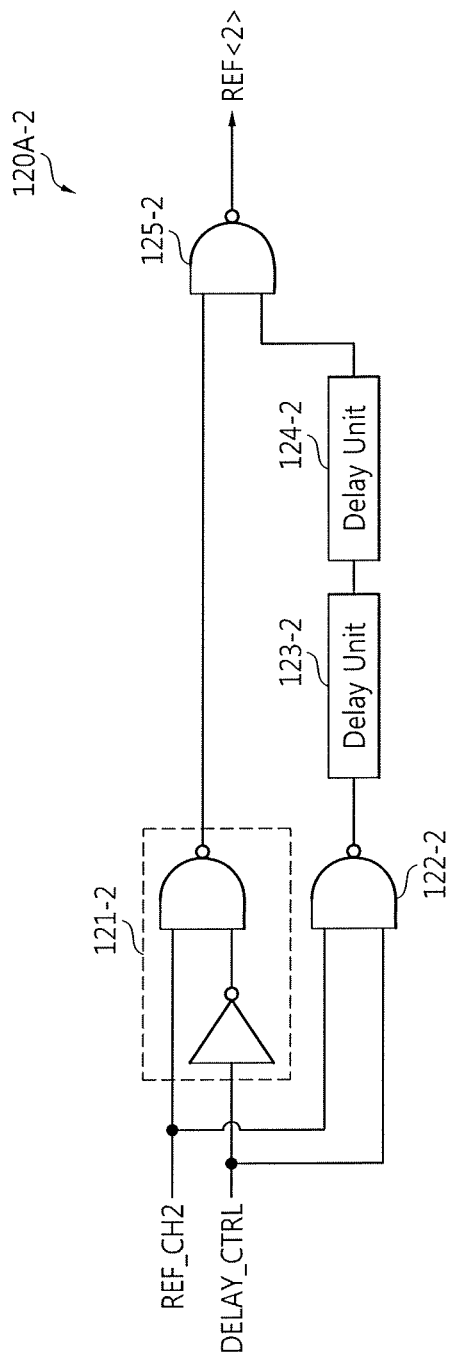
FIG. 15 is a diagram illustrating a second refresh delay module shown in FIG. 7, according to an exemplary embodiment of the inventive concept.
Figure 16:
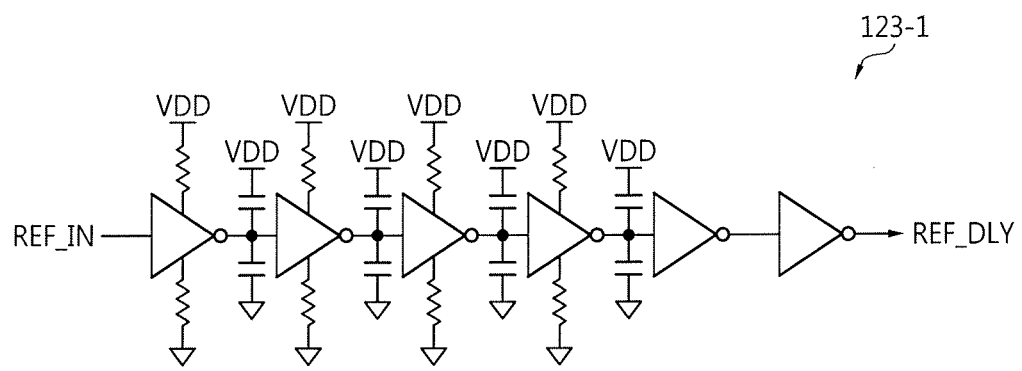
FIG. 16 is a circuit diagram of a delay unit of FIG. 14 according to an exemplary embodiment of the inventive concept.

FIG. 14 is a diagram illustrating the first refresh delay module 120A-1 of FIG. 7 according to an exemplary embodiment of the inventive concept. FIG. 15 is a diagram illustrating the second refresh delay module 120A-2 of FIG. 7 according to an exemplary embodiment of the inventive concept. FIG. 16 is a circuit diagram of a delay unit of FIG. 14 according to an exemplary embodiment of the inventive concept.

Referring to FIGS. 7, 14, 15, and 16, the first refresh delay module 120A-1 includes a first NAND element 121-1 (e.g., a NAND gate an inverter) configured to perform a NAND operation on an inverted signal of a refresh delay control signal DELAY_CTRL and a decoded refresh command REF_CH1, a second NAND element 122-1 (e.g., a NAND gate) configured to perform the NAND operation on the refresh delay control signal DELAY_CTRL and the decoded refresh command REF_CH1, a delay unit 123-1, and a third NAND element 125-1.

The delay unit 123-1 may include an even number of inverters connected in series as illustrated in FIG. 16.

The delay period caused by the delay unit 123-1 may be determined according to the number of inverters and a resister-capacitor (R-C) delay of each of the inverters.

When the refresh delay control signal DELAY_CTRL is enabled to a logic high level, the decoded refresh command REF_CH1 is delayed by the delay unit 123-1 and is then output.

In contrast, when the refresh delay control signal DELAY_CTRL is disabled to a logic low level, the decoded refresh command REF_CH1 is output without passing through the delay unit 123-1, i.e., without being delayed by the delay unit 123-1.

The second refresh delay module 120A-2 has substantially the same structure as that of the first refresh delay module 120A-1, except that the first refresh delay module 120A-1 includes one delay unit 123-1, whereas the second refresh delay module 120A-2 includes two delay units 123-2 and 124-2 connected in series.

Each of the delay units 123-2 and 124-2 may be substantially the same as the delay unit 123-1 of FIG. 16.

Thus, a delay period caused by the second refresh delay module 120A-2 may be about double delay period caused by the first refresh delay module 120A-1.

In an exemplary embodiment, each of the third to eighth refresh delay modules 120A-3 to 120A-8 of FIG. 7 may be substantially the same as the first refresh delay module 120A-1 or the second refresh delay module 120A-2.

For example, the third, fifth, and seventh refresh delay modules 120A-3, 120A-5, and 120A-7 may be substantially the same as the first refresh delay module 120A-1, and the fourth, sixth, and eighth refresh delay modules 120A-4, 120A-6, and 120A-8 may be substantially the same as the second refresh delay module 120A-2.

In an exemplary embodiment, the number of delay units to be connected in series in each of the third to fourth refresh delay modules 120A-3 to 120A-8 of FIG. 7 may be set to be different from the number of delay units to be connected in series in the other refresh delay modules.

As described above, refresh commands corresponding to channels may be deconcentrated by differently setting delay periods caused by at least two among the first to eighth refresh delay modules 120A-1 to 120A-8.

Figure 17:
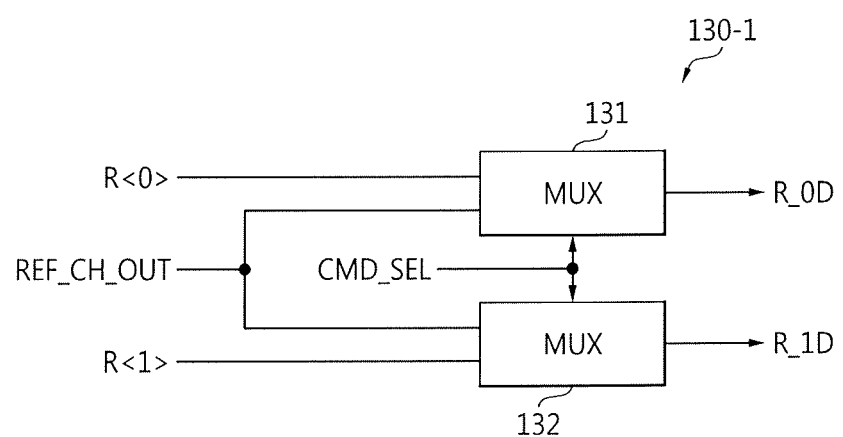
FIG. 17 is a diagram illustrating a first selector of FIG. 7 according to an exemplary embodiment of the inventive concept.
Figure 18:
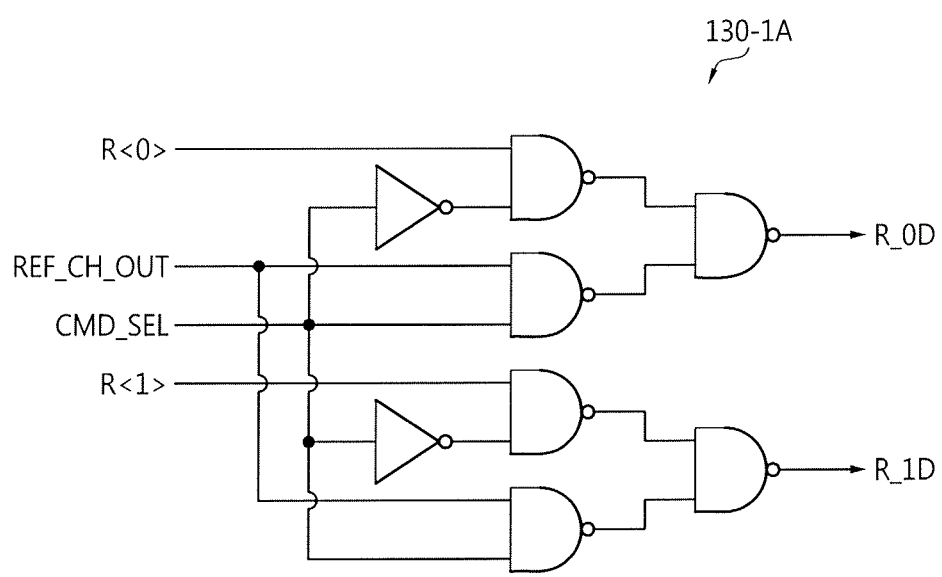
FIG. 18 is a circuit diagram of the first selector of FIG. 17 according to an exemplary embodiment of the inventive concept.

FIG. 17 is a block diagram illustrating the first selector 130-1 of FIG. 7 according to an exemplary embodiment of the inventive concept. FIG. 18 is a circuit diagram of the first selector 130-1A of FIG. 17 according to an exemplary embodiment of the inventive concept.

Referring to FIGS. 7, 17, and 18, the first selector 130-1 includes a first multiplexer (MUX) 131 and a second multiplexer (MUX) 132. Each of the first multiplexer 131 and the second multiplexer 132 may be embodied as a combination of an inverter, a NAND element, and an AND element as illustrated in FIG. 18.

The first multiplexer 131 selects a first command input signal R<0> or an output signal REF_CH_OUT of the first refresh delay module 120A-1 and outputs a first delay command signal R_0D, in response to a command selection signal CMD_SEL. The second multiplexer 132 selects a second command input signal R<1> or the output signal REF_CH_OUT of the first refresh delay module 120A-1 and outputs a second delay command signal R_1D, in response to the command selection signal CMD_SEL.

The first command input signal R<0> and the second command input signal R<1> are bypassed normal commands NCMD<1>, which are 2-bit signals.

In an exemplary embodiment, when a command decoded by the first command decoder 110-1 is not a refresh command REF, a command selection signal CMD_SEL that is logic high may be output. In this case, the first multiplexer 131 may select the first command input signal R<0> and output the first delay command signal R_0D, and the second multiplexer 132 may select the second command input signal R<1> and output the second delay command signal R_1D.

When a command decoded by the first command decoder 110-1 is the refresh command REF, a command selection signal CMD_SEL that is logic low may be output. In this case, the first multiplexer 131 may select the output signal REF_CH_OUT of the first refresh delay module 120A-1 and output the first delay command signal R_0D, and the second multiplexer 132 may select the output signal REF_CH_OUT of the first refresh delay module 120A-1 and output the second delay command signal R_1D.

In an exemplary embodiment, an output signal of the first selector 130-1 includes a 2-bit output signal, i.e., the first delay command signal R_0D and the second delay command signal R_1D, but exemplary embodiments of the inventive concept are not limited thereto.

The first delay command signal R_0D and the second delay command signal R_1D output from the first selector 130-1 are transmitted to the first core-die 210-1.

Thus, the refresh command REF<1> delayed by the first refresh delay module 120A-1 is transmitted to the first core-die 210-1 when a command decoded by the first command decoder 110-1 is the refresh command REF, and the bypassed normal command NCMD<1> is transmitted to the first core-die 210-1 when the command decoded by the first command decoder 110-1 is not the refresh command REF.

Each of the second to eighth selectors 130-2 to 130-8 may have the same structure and operation as that of the first selector 130-1.

Thus, the first to eighth selectors 130-1 to 130-8 each select one of the commands REF<1> to REF<8> output from the refresh control modules 120-1 to 120-8 and the bypassed commands NCMD<1> to NCMD<8>, and respectively transmit selected commands to the core-dies 210-1 to 210-N, according to the command selection signals CMD_SEL_CH1 to CMD_SEL_CH8.

As described above, according to an exemplary embodiment of the inventive concept, whenever commands corresponding to channels are input from a memory controller, the buffer-die 100 may check whether the commands are refresh commands, monitor a degree of concentration of the refresh commands (e.g., the number of refresh commands input during a specific period), and selectively delay or skip the refresh commands, thereby deconcentrating the refresh commands.

According to an exemplary embodiment of the inventive concept, whenever commands corresponding to channels are input from the memory controller, the buffer-die 100 may monitor a degree of concentration of refresh commands (e.g., the number of refresh commands input during a specific period) and selectively delay or skip the refresh commands, thereby deconcentrating the refresh commands.

Figure 19:
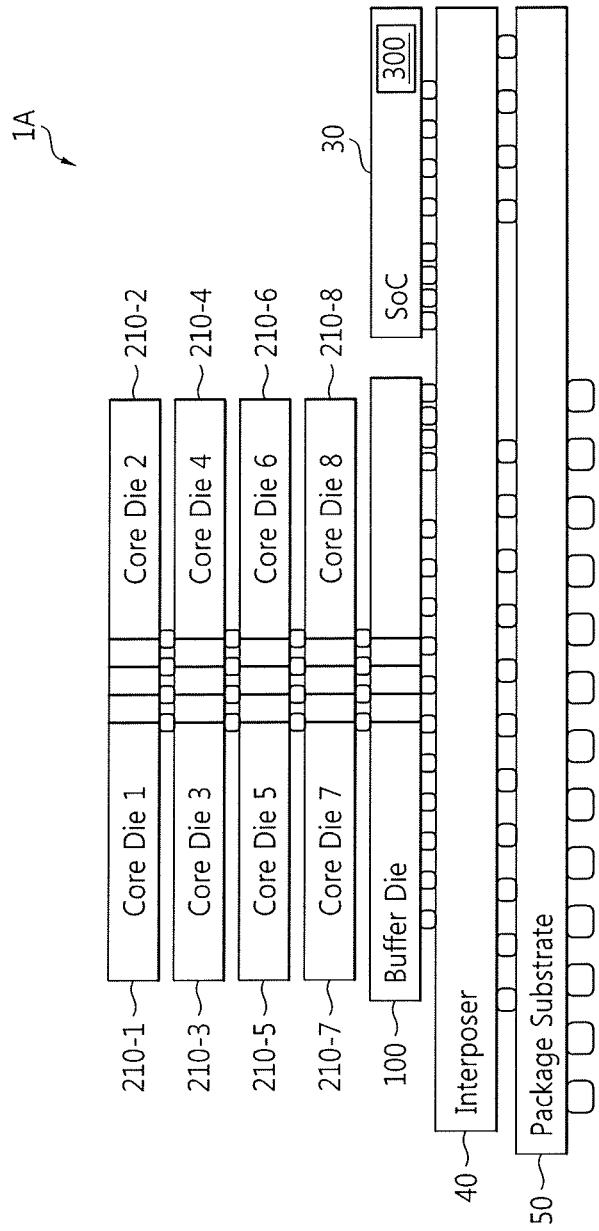
FIG. 19 is a diagram illustrating the structure of a memory system according to an exemplary embodiment of the inventive concept.

FIG. 19 is a diagram illustrating the structure of a memory system 1A according to an exemplary embodiment of the inventive concept. Referring to FIG. 19, the memory system 1A, according to an embodiment of the inventive concept, includes a memory device 10, a SoC 30, an interposer 40, and a package substrate 50. In an embodiment, the interposer is made of silicon.

The memory device 10 may be a high-bandwidth memory (HBM) device and include a buffer-die 100 and first to eighth core-dies 210-1 to 210-8.

The SoC 30 may include a memory controller 300.

The interposer 40 connects the SoC 30 and the buffer-die 100 to each other using wire.

The package substrate 50 supports the SoC 30 and the memory device 10, and connects the SoC 30 and the memory device 10 to a mother board (not shown).

Figure 20:
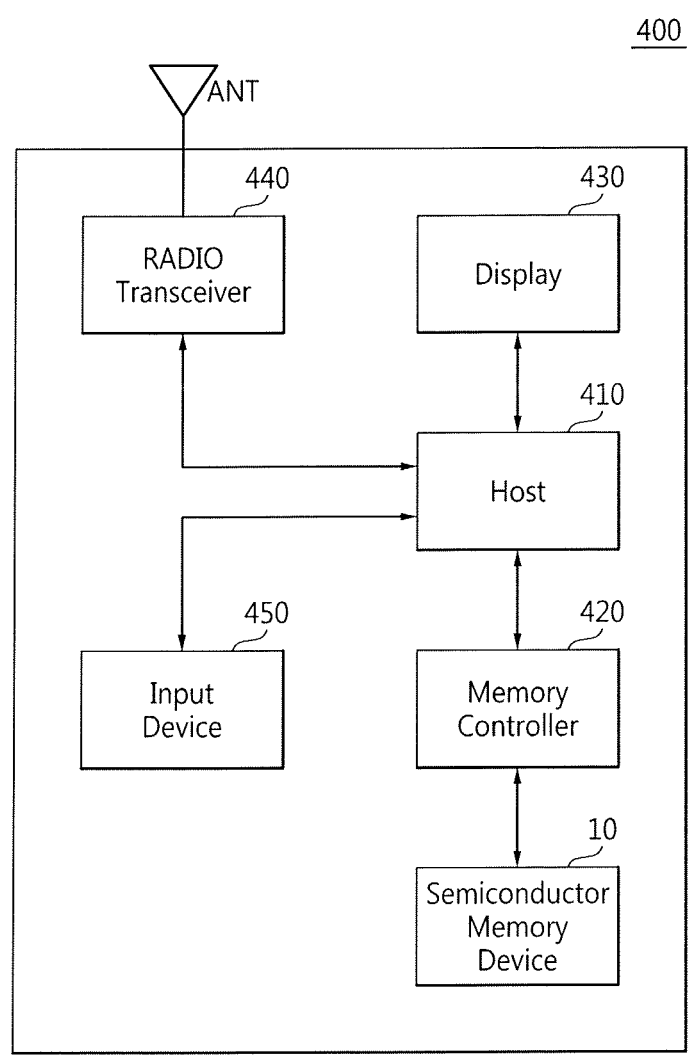
FIG. 20 is a diagram of a computer system including the memory device illustrated in FIG. 1 according to an exemplary embodiment of the inventive concept.

FIG. 20 is a diagram of a computer system 400 including the memory device 10 illustrated in FIG. 1 according to an exemplary embodiment of the inventive concept. Referring to FIGS. 1 and 20, the computer system 400 may be implemented as a cellular phone, a smart phone, a personal digital assistant (PDA), or a wireless communication device.

The computer system 400 includes the memory device 10 and a memory controller 420 controlling the operation of the memory device 10. The memory controller 420 may control a data access operation, e.g., a write operation or a read operation, of the memory device 10 according to the control of a host 410. The memory controller 420 may be the memory controller 300 illustrated in FIG. 1.

Data of the memory device 10 may be displayed through a display 430 according to the control of the host 410 and the memory controller 420. A radio transceiver 440 may transmit or receive radio signals through an antenna ANT. The radio transceiver 440 may convert radio signals received through the antenna ANT into signals that can be processed by the host 410. Accordingly, the host 410 may process the signals output from the radio transceiver 440 and transmit the processed signals to the memory controller 420 or the display 430. The memory controller 420 may store the signals processed by the host 410 in the memory device 10. The radio transceiver 440 may also convert signals output from the host 410 into radio signals and output the radio signals to an external device through the antenna ANT.

An input device 450 enables control signals for controlling the operation of the host 410 or data to be processed by the host 410 to be input to the memory device 10. The input device 450 may be implemented as a pointing device such as a touch pad or a computer mouse, a keypad, or a keyboard.

The host 410 may control the operation of the display 430 to display data output from the memory controller 420, data output from the radio transceiver 440, or data output from the input device 450. The memory controller 420, which controls the operations of the memory device 10, may be implemented as a part of the host 410 or as a separate chip.

Figure 21:
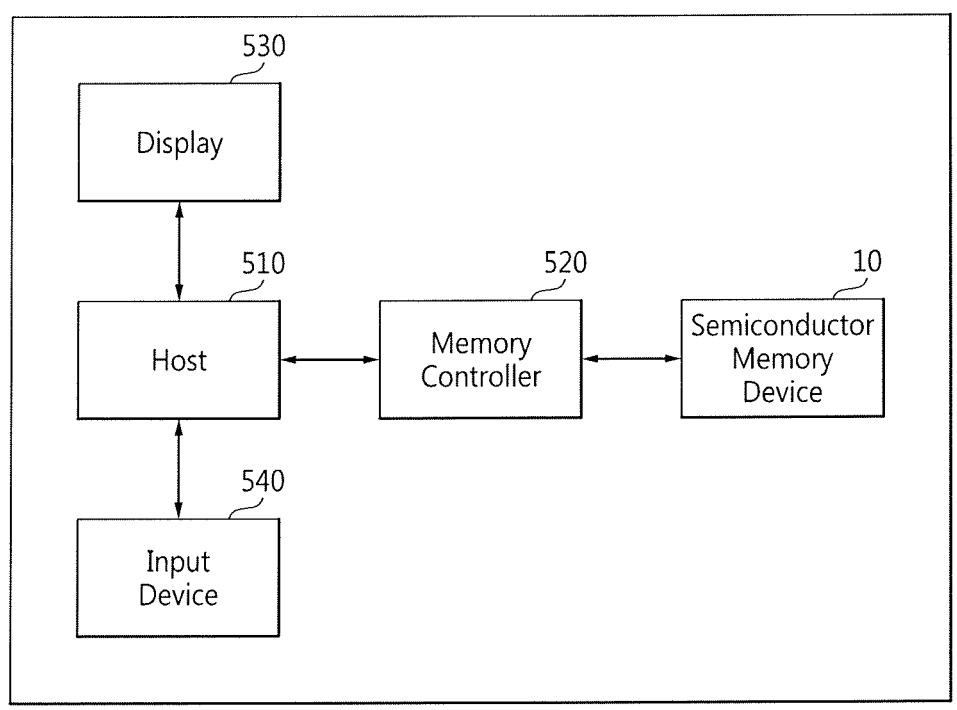
FIG. 21 is a block diagram of a computer system including the memory device illustrated in FIG. 1 according to an exemplary embodiment of the inventive concept.

FIG. 21 is a block diagram of a computer system 500 including the memory device 10 illustrated in FIG. 1 according to an exemplary embodiment of the inventive concept. The computer system 500 may be implemented as a personal computer (PC), a tablet PC, a net-book, an e-reader, a personal digital assistant (PDA), a portable multimedia player (PMP), an MP3 player, or an MP4 player.

The computer system 500 includes a host 510, the memory device 10, a memory controller 520 controlling the data processing operations of the memory device 10, a display 530 and an input device 540.

The host 510 may display data stored in the memory device 10 through the display 530 according to data input through the input device 540. The input device 540 may be implemented by a pointing device such as a touch pad or a computer mouse, a keypad, or a keyboard.

The host 510 may control the overall operation of the computer system 500 and the operations of the memory controller 520. The memory controller 520 may be the memory controller 300 illustrated in FIG. 1.

According to an exemplary embodiment, the memory controller 520, which may control the operations of the memory device 10, may be implemented as a part of the host 510 or as a separate chip.

Figure 22:
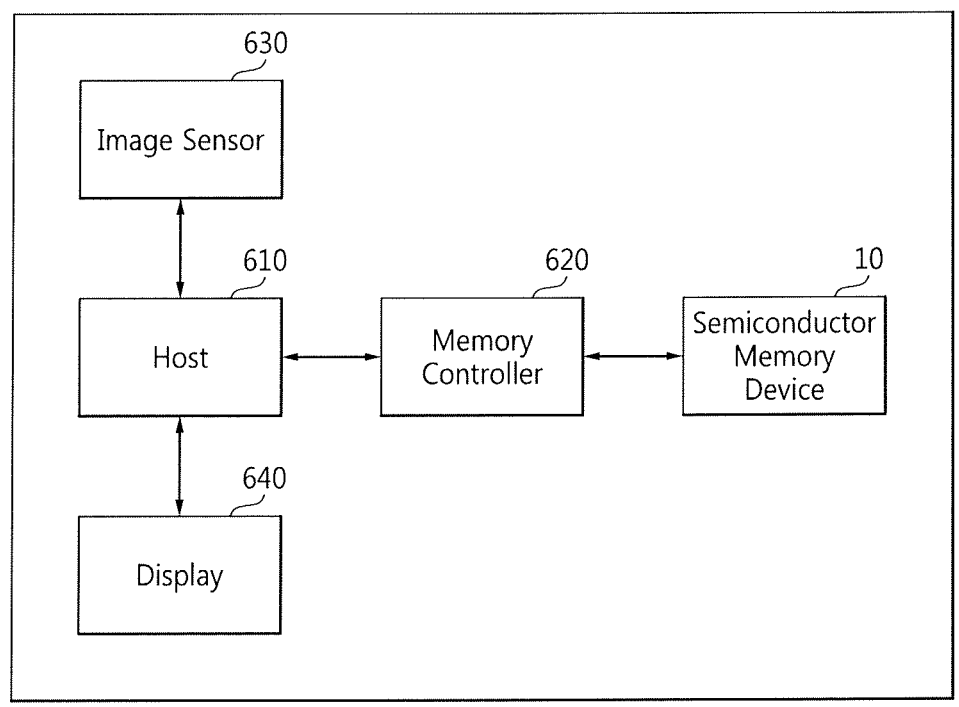
FIG. 22 is a block diagram of a computer system including the memory device illustrated in FIG. 1 according to an exemplary embodiment of the inventive concept.

FIG. 22 is a block diagram of a computer system 600 including the memory device 10 illustrated in FIG. 1 according to an exemplary embodiment of the inventive concept. The computer system 600 may be implemented as an image processing device like a digital camera, a cellular phone equipped with a digital camera, or a smart phone equipped with a digital camera.

The computer system 600 includes a host 610, the memory device 10 and a memory controller 620 controlling the data processing operations, such as a write operation or a read operation, of the memory device 10. The computer system 600 further includes an image sensor 630 and a display 640.

The image sensor 630 included in the computer system 600 converts optical images into digital signals and outputs the digital signals to the host 610 or the memory controller 620. The digital signals may be controlled by the host 610 to be displayed through the display 640 or stored in the memory device 10 through the memory controller 620.

Data stored in the memory device 10 may be displayed through the display 640 according to the control of the host 610 or the memory controller 620. The memory controller 620, which may control the operations of the memory device 10, may be implemented as a part of the host 610 or as a separate chip. The memory controller 620 may be the memory controller 300 illustrated in FIG. 1.

Figure 23:
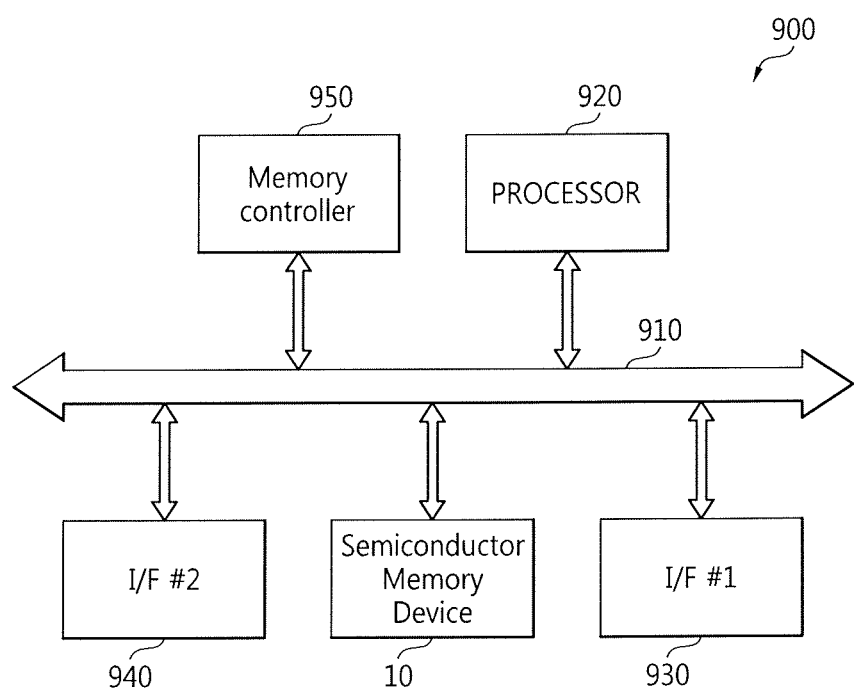
FIG. 23 is a block diagram of a computer system including the memory device illustrated in FIG. 1 according to an exemplary embodiment of the inventive concept.

FIG. 23 is a block diagram of a computer system 900 including the memory device 10 illustrated in FIG. 1 according to an exemplary embodiment of the inventive concept. The computer system 900 may include the memory device 10, a memory controller 950, a processor 920, a first interface 930 and a second interface 940, which are connected to a data bus 910.

According to exemplary embodiments, the computer system 900 may include a portable device such as a mobile phone, MP3 (MPECG Audio Layer-3) player, or MP4 (MPECG Audio Layer-4) player, a personal digital assistant (PDA), or a portable media player (PMP).

According to exemplary embodiments, the computer system 900 may include a data processing system such as a personal computer (PC), a notebook-sized personal computer or a laptop computer.

According to exemplary embodiments, the computer system 900 may include a memory card such as a secure digital (SD) card or a multimedia card (MMC)

According to exemplary embodiments, the computer system 900 may include a smart card or a solid state drive (SSD)

The memory device 10, the memory controller 950 and the processor 920 may be implemented as one chip, for example, a system on chip (SoC) or as separate devices.

According to exemplary embodiments, the processor 920 may process data input through the first interface 930 and write the data in the memory device 10.

According to exemplary embodiments, the processor 920 may read data from the memory device 10 and output the data through the first interface 930. In this case, the first interface 930 may be an input/output device.

The second interface 940 may be a wireless interface for wireless communication.

According to exemplary embodiments, the second interface 940 may be implemented by software or firmware. The memory controller 950 may be the memory controller 300 illustrated in FIG. 1.

An embodiment of the inventive concept can also be embodied as computer-readable codes on a computer-readable medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices.

The computer-readable recording medium can also be distributed over network coupled computer systems so that the computer-readable code is stored and executed in a distributed fashion. Also, functional programs, codes, and code segments may be developed accomplish embodiments of the inventive concept.

According to an exemplary embodiment of the inventive concept, in a memory device including a plurality of independent channels, when commands corresponding to the channels are input from a memory controller, refresh commands corresponding to the channels may be deconcentrated by determining whether the commands are refresh commands, thereby decreasing power noise.

While the inventive concept has been particularly shown and described with reference to exemplary embodiments thereof, it will be understood that various changes in form and details may be made therein without departing from the spirit and scope of the inventive concept.

What is claimed is:

1. A memory device comprising:
a buffer memory configured to receive commands from a memory controller via first to $N^{th}$ channels, wherein N denotes an integer which is equal to or greater than two; and first to $N^{th}$ core memories each connected to the buffer memory via one of the first to $N^{th}$ channels, wherein the buffer memory deconcentrates refresh commands corresponding to the first to $N^{th}$ core memories that are input to the buffer memory via the first to Nth channels by skipping or delaying transmission of a refresh command among the refresh commands to one of the core memories based on a number of commands input during a specific period, wherein the buffer memory comprises a refresh control determining circuit configured to count a number of commands received via the first to $N^{th}$ channels during the specific period to generate a count value, and compare the count value with a preset threshold to determine whether the refresh commands are to be deconcentrated.

2. The memory device of claim 1, wherein the refresh control determining circuit counts only refresh commands among the commands received via the first to $N^{th}$ channels to generate the count value, and outputs a refresh control signal based on a result of the compare.

3. The memory device of claim 2, wherein the buffer memory comprises:
command decoders corresponding to the first to $N^{th}$ channels, and configured to decode the commands received via the first to $N^{th}$ channels and output command selection signals according to whether the decoded commands are refresh commands or not;

refresh control circuits corresponding to the first to $N^{th}$ channels, and configured to selectively delay or skip the refresh commands according to the refresh control signal; and selectors corresponding to the first to $N^{th}$ channels, and configured to each select one of commands output from the refresh control circuits and bypassed commands and to respectively transmit the selected commands to the first to $N^{th}$ core memories, according to the command selection signals, wherein the bypassed commands are normal commands other than the refresh commands that do not pass through the refresh control circuits.

4. The memory device of claim 2, wherein the refresh control determining circuit comprises:
a command counter configured to count a number of the refresh commands input during the specific period and output the count value; and a comparator configured to enable the refresh control signal when the count value is equal to or greater than the preset threshold.

5. The memory device of claim 1, wherein the refresh control determining circuit comprises:
a refresh detector configured to determine whether at least one of the refresh commands is input via the first to $N^{th}$ channels during the specific period, and output a latch output signal; and a voting block configured to be enabled to determine whether the number of the refresh commands is equal to or greater than the preset threshold and output a refresh delay control signal, according to the latch output signal.

6. The memory device of claim 5, wherein the refresh detector comprises an oscillator configured to generate an oscillator output signal having a predetermined cycle, in response to the latch output signal, wherein the latch output signal is reset based on the oscillator output signal.

7. The memory device of claim 5, Wherein the buffer memory comprises:

command decoders corresponding to the first to $N^{th}$ channels, and configured to decode the commands received via the first to $N^{th}$ channels and output command selection signals according to whether the decoded commands are refresh commands or not;

refresh delay circuits corresponding to the first to $N^{th}$ channels, and configured to selectively delay the refresh commands according to the refresh control signal; and selectors corresponding to the first to $N^{th}$ channels, and configured to each select one of commands output from the refresh delay modules and bypassed commands and respectively transmit the selected commands to the first to $N^{th}$ core memories, according to the command selection signal.

8. The memory device of claim 7, wherein the command decoders output a command selection signal having a first logic level when the decoded commands are the refresh commands, and output a command selection signal having a second logic level when the decoded commands are not the refresh commands.

9. The memory device of claim 5, wherein the refresh delay circuits output the refresh commands without delaying the refresh commands when the refresh delay control signal has a first logic level, and delay the refresh commands using at least one delay circuit and output the delayed refresh commands when the refresh delay control signal has a second logic level.

10. The memory device of claim 5, wherein at least two among the refresh delay circuits, delay signals input thereto for different delay periods.

11. The memory device of claim 1, wherein a memory comprising the buffer memory and the core memories has a three-dimensional (3D) stack structure.

12. A memory system comprising:
a memory controller;
first to $N^{th}$ core memories configured to communicate with the memory controller via first to $N^{th}$ independent channels, wherein N denotes an integer which is equal to or greater than two; and
a buffer memory configured to transmit commands and data to be exchanged between the memory controller and the first to $N^{th}$ core memories,
wherein the buffer memory deconcentrates refresh commands corresponding to the first to $N^{th}$ core memories that are input to the buffer memory via the first to Nth channels by skipping transmission of a refresh command among the refresh commands to one of the core memories based on a number of commands input during a specific period.

13. The memory system of claim 12, wherein the buffer memory comprises a refresh control determining circuit configured to count a number of all commands received via the first to $N^{th}$ channels during a specific period to generate a count value, and compare the count value with a preset threshold to determine whether the refresh commands are to be deconcentrated.

14. The memory system of claim 12, wherein the buffer memory counts a number of the refresh commands received via the first to $N^{th}$ channel during a specific period to generate a count value, and compares the count value with a preset threshold to determine whether the refresh commands are to be deconcentrated.

15. The memory system of claim 14, wherein the buffer memory comprises:
command decoders corresponding to the first to $N^{th}$ channels, and configured to decode the commands received via the first to $N^{th}$ channels and output command selection signals according to whether the decoded commands are refresh commands or not;
refresh control circuits corresponding to the first to $N^{th}$ channels, and configured to selectively skip the refresh commands according to a refresh control signal; and
selectors corresponding to the first to $N^{th}$ channels, and configured to each select one of commands output from the refresh control circuits and bypassed commands and respectively transmit the selected commands to the first to $N^{th}$ core memories, according to the command selection signal,
wherein the bypassed commands are normal commands other than the refresh commands that do not pass through the refresh control circuits.

16. The memory system of claim 14, wherein the refresh control determining circuit comprises:
a command counter configured to count the number of the refresh commands input during the specific period and outputs the count value; and
a comparator configured to enable a refresh control signal when the count value is equal to or greater than the preset threshold.

17. The memory system of claim 14, wherein the refresh control determining circuit comprises:
a refresh detector configured to detect whether at least one of the refresh commands is input via the first to $N^{th}$ channels during the specific period; and
a voting block configured to be enabled according to a result of detecting the number of the refresh commands by using the refresh detector, and to output a refresh control signal when the number of the refresh commands is equal to or greater than the preset threshold.

* * * * *